US012671366B2

(12) United States Patent
Yang et al.

(10) Patent No.: US 12,671,366 B2
(45) Date of Patent: Jun. 30, 2026

(54) DOHERTY POWER AMPLIFIER AND ELECTRONIC DEVICE INCLUDING IT IN WIRELESS COMMUNICATION SYSTEM

(71) Applicants:Samsung Electronics Co., Ltd., Suwon-si (KR); Research & Business Foundation SUNGKYUNKWAN UNIVERSITY, Suwon-si (KR)

(72) Inventors: Youngoo Yang, Suwon-si (KR); Seunghoon Jee, Suwon-si (KR); Hyunuk Kang, Suwon-si (KR); Kyoungtae Kim, Suwon-si (KR); Changwook Kim, Suwon-si (KR); Seungmin Woo, Suwon-si (KR); Youngyoon Woo, Suwon-si (KR)

(73) Assignees: Samsung Electronics Co., Ltd., Suwon-si (KR); Research & Business Foundation SUNGKYUNKWAN UNIVERSITY, Suwon-si (KR)

( * ) Notice: Subject to any disclaimer, the term of this patent is extended or adjusted under 35 U.S.C. 154(b) by 519 days.

(21) Appl. No.: 18/302,335

(22) Filed: Apr. 18, 2023

(65) Prior Publication Data

US 2023/0378912 A1 Nov. 23, 2023

Related U.S. Application Data

(63) Continuation of application No. PCT/KR2023/003383, filed on Mar. 13, 2023.

(30) Foreign Application Priority Data

May 23, 2022 (KR) ........................ 10-2022-0063124
Jun. 7, 2022 (KR) ........................ 10-2022-0069183

(51) Int. Cl.
*H03F 1/02* (2006.01)
*H03F 3/24* (2006.01)

(52) U.S. Cl.
CPC ........... *H03F 1/0288* (2013.01); *H03F 3/245* (2013.01); *H03F 2200/451* (2013.01)

(58) Field of Classification Search
None
See application file for complete search history.

(56) References Cited

U.S. PATENT DOCUMENTS 7,663,435 B2    2/2010  Kim et al.
8,198,938 B2    6/2012  Yu
(Continued)

FOREIGN PATENT DOCUMENTS

JP        2018-530263 A    10/2018
KR        101654927 B1      9/2016
(Continued)

OTHER PUBLICATIONS

International Search Report dated Jun. 15, 2023, issued in International Application No. PCT/KR2023/003383.
(Continued)

*Primary Examiner* — Andrea Lindgren Baltzell
*Assistant Examiner* — Malane Lieng
(74) *Attorney, Agent, or Firm* — Jefferson IP Law, LLP

(57) ABSTRACT

An electronic device including a Doherty power amplifier is provided. The electronic device includes a carrier amplifier, a first circuit coupled to an output terminal of the carrier amplifier, a peaking amplifier, a second circuit coupled to an output terminal of the peaking amplifier, and a network circuit. The network circuit includes the Doherty power amplifier and a transmission line for impedance matching with a resonance circuit. The resonance circuit may be disposed between a first area and a second area of the transmission line. The Doherty power amplifier provides an output impedance in a first range distributed based on a frequency within a bandwidth. The network circuit provides (Continued)

250 a load impedance in a second range distributed based on the frequency within the bandwidth. The first area of the transmission line provides a first phase shift impedance. The second area of the transmission line provides a second phase shift impedance.

20 Claims, 21 Drawing Sheets

(56)                    References Cited

U.S. PATENT DOCUMENTS

| | | |
|---|---|---|
| 9,780,733 B2 | 10/2017 | Jeon et al. |
| 9,948,246 B1 | 4/2018 | Ma et al. |
| 10,511,265 B2 | 12/2019 | Ai et al. |
| 10,972,053 B2 | 4/2021 | Dani |
| 11,201,592 B2 | 12/2021 | Ahn et al. |
| 2019/0348953 A1 | 11/2019 | Dani |
| 2020/0228065 A1 | 7/2020 | Ahn et al. |
| 2021/0226586 A1 | 7/2021 | Dani |
| 2023/0145401 A1 | 5/2023 | Alpman et al. |

FOREIGN PATENT DOCUMENTS

| | | |
|---|---|---|
| KR | 101910896 B1 | 10/2018 |
| KR | 10-1934933 B1 | 1/2019 |
| KR | 10-2019-0089955 A | 7/2019 |
| KR | 10-2020618 B1 | 11/2019 |
| KR | 10-2022-0063616 A | 5/2022 |

OTHER PUBLICATIONS

European Search Report dated Jun. 4, 2025, issued in European Application No. 23811957.2.

<u>300</u>

303

<u>310</u>

400

410

700

1300

DOHERTY POWER AMPLIFIER AND ELECTRONIC DEVICE INCLUDING IT IN WIRELESS COMMUNICATION SYSTEM

CROSS-REFERENCE TO RELATED APPLICATION(S)

This application is a continuation application, claiming priority under § 365(c), of an International Application No. PCT/KR2023/003383, filed on Mar. 13, 2023, which is based on and claims the benefit of a Korean patent application number 10-2022-0063124, filed on May 23, 2022, in the Korean Intellectual Property Office, and of a Korean patent application number 10-2022-0069183, filed on Jun. 7, 2022, in the Korean Intellectual Property Office, the disclosure of each of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd. and 2) Research & Business Foundation SUNGKYUNKWAN UNIVERSITY.

BACKGROUND

1. Field

The disclosure relates to wireless communication system. More particularly, the disclosure relates to a Doherty power amplifier and an electronic device including it, in the wireless communication system.

2. Description of Related Art

A product equipped with multiple antennas is being developed to improve communication performance, and equipment with an increasingly large number of antennas is expected to be used by using Massive multiple input-multiple output (MIMO) technology. As the number of an antenna element in a communication device increases, the number of radio frequency (RF) components (e.g., power amplifier (PA)) inevitably increases accordingly.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a device and a method for expanding a frequency band of a Doherty power amplifier in a wireless communication system.

Another aspect of the disclosure is to provide a circuit of the Doherty power amplifier and the device including it for increasing efficiency of a 5th generation (5G) transmitter in the wireless communication system.

Another aspect of the disclosure is to provide the circuit of the Doherty power amplifier and the device including it for provide a high gain in a wide frequency band through the dispersion of impedance in a frequency domain in the wireless communication system.

Additional aspects will be set forth in part in the description which follows and, in part, will be apparent from the description, or may be learned by practice of the presented embodiments.

In accordance with an aspect of the disclosure, an electronic device including a Doherty power amplifier is provided. The electronic device includes a carrier amplifier, a first circuit coupled to an output terminal of the carrier amplifier, a peaking amplifier, a second circuit coupled to an output terminal of the peaking amplifier, and a network circuit. The network circuit may include a transmission line for impedance matching with a resonance circuit and the Doherty power amplifier. The resonance circuit may be disposed between a first area and a second area of the transmission line. In the electronic device, the Doherty power amplifier may provide an output impedance in a first range distributed based on a frequency within a bandwidth, and the network circuit may provide a load impedance. The network circuit may provide a load impedance in a second range distributed based on the frequency within the bandwidth. The first area of the transmission line may provide a first phase shift impedance to reduce a difference between the output impedance in the first range and the load impedance in the second range. The second area of the transmission line may provide a second phase shift impedance.

In accordance with another aspect of the disclosure, a radio frequency integrated circuit (RFIC) is provided. The RFIC includes a plurality of radio frequency (RF) processing chains. Each of the plurality of RF processing chains may include a phase shifter and a Doherty power amplifier. The Doherty power amplifier may include a carrier amplifier, a first circuit coupled to output terminal of the carrier amplifier, a peaking amplifier, a second circuit coupled to the output terminal of the peaking amplifier, and a network circuit. The network circuit may include a transmission line for impedance matching with a resonance circuit and the Doherty power amplifier. In the electronic device, the resonance circuit may be disposed between a first area and a second area of the transmission line. The Doherty power amplifier may provide an output impedance in a first range distributed based on a frequency within a bandwidth, and the network circuit may provide a load impedance. The network circuit may provide a load impedance in a second range distributed based on the frequency within the bandwidth. The first area of the transmission line may provide a first phase shift impedance to reduce a difference between the output impedance in the first range and the load impedance in the second range. The second area of the transmission line may provide a second phase shift impedance.

A Doherty power amplifier circuit and an electronic device including it according to embodiments of the disclosure can provide a wide frequency band through a resonance circuit that is disposed within a transmission line for impedance matching with an output terminal of the Doherty power amplifier.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
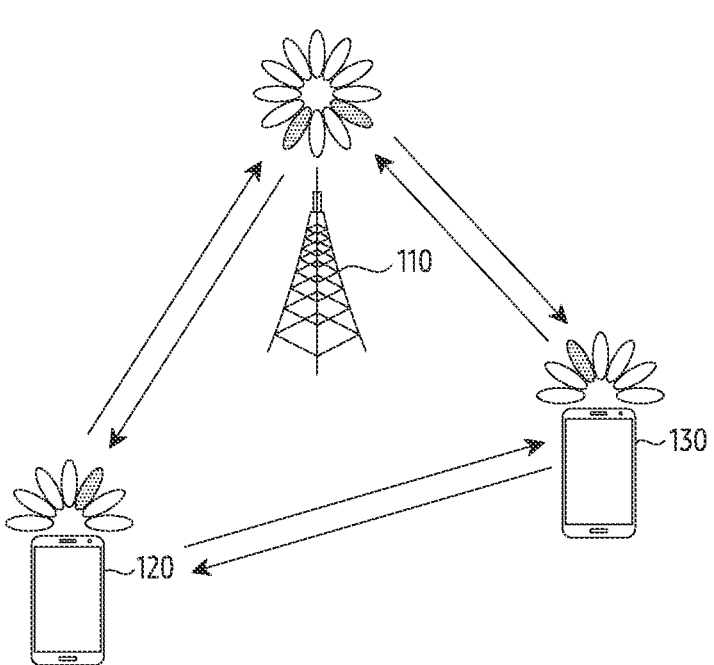
FIG. 1 illustrates a wireless communication system according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In various embodiments of the disclosure described below, a hardware approach is described as an example. However, since the various embodiments of the disclosure include technology that use both hardware and software, the various embodiments of the disclosure do not exclude a software-based approach.

A term referring to an amplifier of an electronic device and related components connected to the amplifier (e.g., amplification circuit, amplifier circuit, matching circuit, impedance matching circuit, post matching network, output matching circuit), a term referring to a component (e.g., substrate, plate, printed circuit board (PCB), flexible PCB (FPCB), module, antenna, antenna element, circuit, processor, chip, component, device), a term referring to a shape of a component (e.g., structure, structure, supporting part, contacting part, protruding part, opening part), a term referring to a connecting part between structures (e.g., connecting part, contacting part, supporting part, contact structure, conductive member, assembly), a term referring to a circuit (e.g., PCB, FPCB, signal line, feeding line, data line, RF signal line, antenna line, RF path, RF module, RF circuit). and the like used in the following description are illustrated for convenience of description. Thus, the disclosure is not limited to terms described below, and another term having an equivalent technical meaning may be used. In addition, a term such as ' . . . module', ' unit', ' . . . part', ' . . . section', ' . . . structure', ' . . . body', and the like used below may mean at least one shape structure or may mean a unit that processes a function.

In addition, in the disclosure, in order to determine whether a specific condition is satisfied or fulfilled, an expression of more than or less than may be used, but this is only a description for expressing an example, and does not exclude description of more than or equal to or less than or equal to. A condition described as 'more than or equal to' may be replaced with' more than', a condition described as 'less than or equal to' may be replaced with 'less than', and a condition described as 'more than or equal to and less than' may be replaced with 'more than and less than or equal to'.

Hereinafter, the disclosure relates to a power amplifier, a network circuit, and an electronic device including the same in a wireless communication system. Specifically, the disclosure proposes a circuit in which a Doherty power amplifier and the network circuit are combined in the wireless communication system and the electronic device including the same. The network circuit may include a resonance circuit for band expansion. In addition, through disposition of capacitors and inductors in the network circuit, miniaturization of a product including the Doherty power amplifier may be achieved.

FIG. 1 illustrates a wireless communication system according to an embodiment of the disclosure.

Referring to FIG. 1, a drawing 100 illustrates a base station 110, a terminal 120, and a terminal 130 as some of nodes using a radio channel in the wireless communication system. FIG. 1 illustrates only one base station, but may further include another base station that is the same as or similar to the base station 110.

The base station 110 is a network infrastructure that provides radio access to the terminal 120. The base station 110 has coverage defined based on a distance capable of transmitting a signal. The base station 110 may be referred to as a millimeter wave (mmWave) equipment, an access point (AP), an eNodeB (eNB), a 5th generation node (5G node), a 5G NodeB (NB), a wireless point, a transmission/reception point (TRP), an access unit, a distributed unit (DU), a radio unit (RU), a massive multiple input multiple output (MIMO) unit (MMU), a remote radio head (RRH), or another term having an equivalent technical meaning in addition to the base station. The base station 110 may transmit a downlink signal or may receive an uplink signal.

The terminal 120 is a device used by a user and performs communication with the base station 110 through the radio channel. In some cases, the terminal 120 may be operated without user involvement. In other words, the terminal 120 is a device that performs machine type communication (MTC) and may not be carried by a user. The terminal 120 may be referred to as a user equipment (UE), a mobile station, a subscriber station, a customer premises equipment (CPE), a remote terminal, a wireless terminal, an electronic device, a terminal for vehicle, a user device, or another term having an equivalent technical meaning in addition to the terminal.

The terminal 120 illustrated in FIG. 1 may support vehicle communication. In case of the vehicle communication, in LTE system, standardization work for vehicle-to-everything (V2X) technology based on a device-to-device (D2D) communication structure was completed in third generation partnership project (3GPP) Release 14 and Release 15, and an effort is currently underway to develop V2X technology based on 5G new radio (NR). In NR V2X, unicast communication, groupcast (or multicast) communication, and broadcast communication between the terminals are supported.

The power amplifier described in the embodiments of the disclosure is a component used for power amplification of radio frequency (RF), and the operation and configuration of the disclosure are described as an example of signal transmission in the base station, but embodiments of the disclosure are not limited thereto. The structure of the power amplifier proposed in the disclosure and equipment including the same may be implemented not only in the base station but also in the terminal. In other words, embodiments of the disclosure may be used not only for downlink transmission of the base station, but also for uplink transmission of the terminal and sidelink communication of the terminal.

Figure 2A:
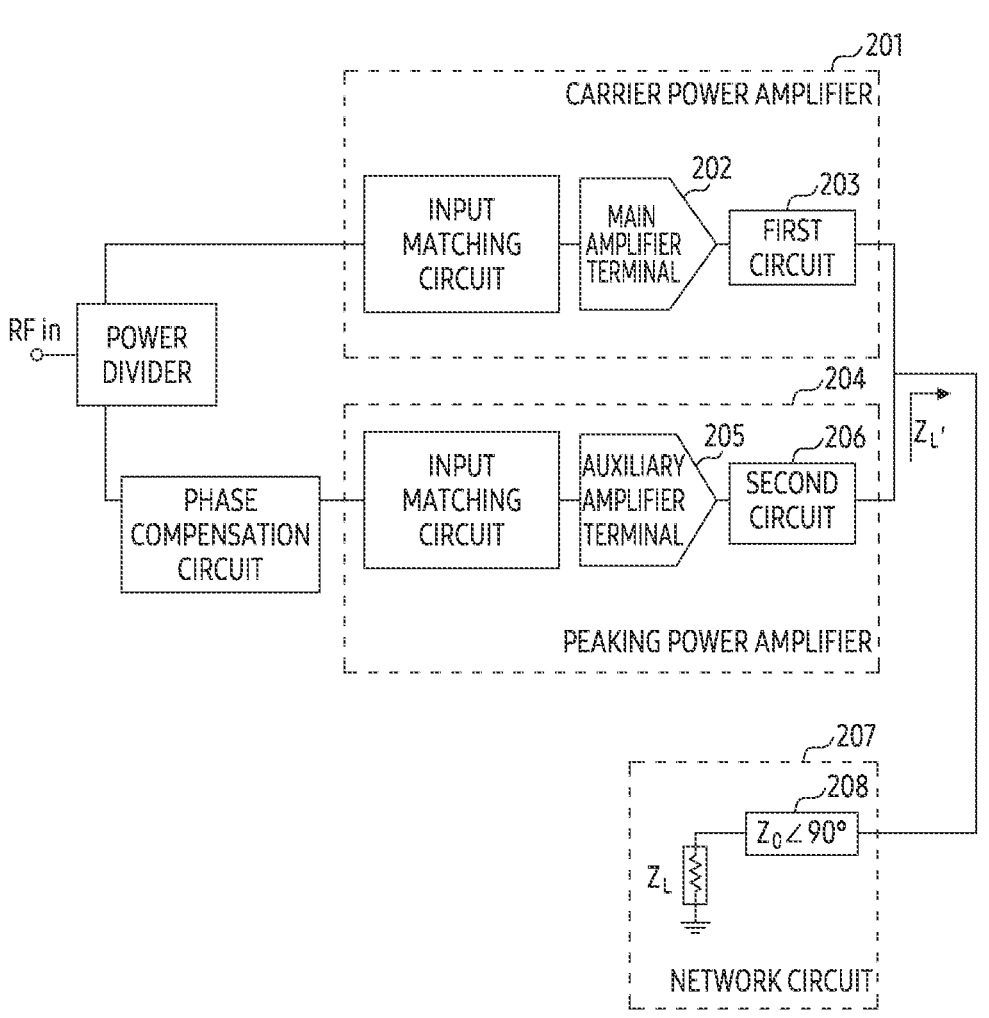
FIG. 2A illustrates an example of a Doherty power amplifier and a network circuit disposition according to an embodiment of the disclosure.

FIG. 2A illustrates an example of a Doherty power amplifier and a network circuit disposition according to an embodiment of the disclosure. The network circuit may not include a resonance circuit. The network circuit may include a transmission line for impedance matching.

Referring to FIG. 2A, a communication circuit 200 illustrates the Doherty power amplifier and the network circuit. The Doherty power amplifier may include a main amplifier terminal 202 and a carrier amplifier 201. The carrier amplifier 201 may include a first circuit 203 for output matching. The Doherty power amplifier may include a peaking amplifier 204. The peaking amplifier 204 may include an auxiliary amplifier terminal 205 and a second circuit 206 for output matching. The peaking amplifier 204 may include an auxiliary amplifier terminal 205 and a second circuit 206 for output matching. A network circuit 207 may include a transmission line 208 having an electrical length of 90 degrees. The Doherty power amplifier may include the carrier amplifier 201 and the peaking amplifier 204. The carrier amplifier 201 may be referred to as a main amplifier, and the peaking amplifier 204 may be referred to as an auxiliary amplifier in addition to the peaking amplifier 204. In general, at low power, the carrier amplifier 201 operates to maintain high efficiency, and at high power, two amplifiers, in other words, the carrier amplifier 201 and the peaking amplifier 204 operate in parallel. Depending on a required characteristic of the amplifier, a ratio of the two amplifiers may vary. In this case, an impedance matching problem and a power combining problem may occur. To solve this problem, the Doherty power amplifier may include a circuit for output matching.

The carrier amplifier 201 is generally an amplifier of an AB-class (operating point moves to an A-class bias) or a B-class (operating point at a cut-off point of a transistor), but the peaking amplifier 204 is generally an amplifier of C-class (operating point below the cut-off point of the transistor) amplifier and forms many distortions. Linearity is maintained by adjusting the bias so that the formed distortion and the distortion of the carrier amplifier 201 offset each other. The Doherty power amplifier may include a structure for connecting the carrier amplifier 201 and the peaking amplifier 204. In this case, the Doherty power amplifier may be coupled to the network circuit for impedance matching. The network circuit may include the transmission line 208 having the electrical length of a designated size (e.g., 90 degrees) for impedance matching.

The Doherty power amplifier may be connected to the transmission line 208. The transmission line 208 may be connected to the output of the carrier amplifier 201 of the Doherty power amplifier and the output of the peaking amplifier 204 of the Doherty power amplifier. In other words, the Doherty power amplifier may have a structure that connects the carrier amplifier 201 and the peaking amplifier 204 in parallel based on the transmission line 208 having the electrical length of 90 degrees. As the power level increases, the amount of current supplied to the load by the peaking amplifier 204 increases. Efficiency of the amplifier may be increased through adjustment of load impedance and impedance matching of each of the carrier amplifier 201 and the peaking amplifier 204. Specifically, the basic operating principle of the Doherty power amplifier may be explained as load modulation (or Active Load Pull) by the output current of the peaking amplifier 204. The operation of the Doherty power amplifier may be divided into three types: a low power level area, an intermediate power level area in which load modulation occurs, and a maximum power level area. The peaking amplifier 204 does not operate in the low power level area. The peaking amplifier 204 may be viewed as an open circuit. In this case, the carrier amplifier 201 may operate with 2Ropt (Ropt: optimal load impedance of the amplifier). Efficiency of the carrier amplifier 201 may be simultaneously increased as output power increases and may saturated at a point 6 dB backoff from maximum output level. In the intermediate power level area, the carrier amplifier 201 may be saturated and may operate at maximum efficiency. When input power increases and reaches the 6 dB backoff point, which is the intermediate power level, the peaking amplifier 204 may operate. An impedance conversion circuit may generate load modulation from 2Ropt to Ropt. In the maximum power level area, the load of the carrier amplifier 201 and the peaking amplifier 204 operate as Ropt, and each amplifier may supply half of the output power.

The communication circuit 200 represents the Doherty power amplifier, and the transmission line 208 for impedance matching may have the electrical length of 90 degrees and characteristic impedance of $Z_0$. When trying to convert $Z_L$ to $Z'_L$, which is an appropriate impedance for the circuit for output matching of the carrier amplifier 201 and the peaking amplifier 204, the characteristic impedance of $Z_0$ may be as shown in Equation 1.

$$Z_0 = \sqrt{Z_L Z'_L} \qquad \text{Equation 1}$$

The $Z_0$ represents the characteristic impedance of the transmission line 208, the $Z_L$ represents the load impedance, and the $Z'_L$ may be equivalent impedance required by an output matching circuit of the main amplifier and an output matching circuit of the auxiliary amplifier.

When the network circuit does not include the resonance circuit, the equivalent impedance $Z'_L$ of the first circuit 203 for matching and the second circuit 206 for matching is not dispersed according to frequency, so the band may be limited compared to the case where the impedance is dispersed. On a Smith chart, the impedance of the Doherty circuit draws an arc according to the frequency, and the impedance $Z'_L$ may be a dotted form. As difference between the impedance of the Doherty circuit and the impedance $Z'_L$ is small, matching may be possible in a wider band. In case that only the resonance circuit is added to the network circuit, the dispersed impedance is not rotated. Thus, by adding the resonance circuit to the transmission line rotating the impedance, the difference between the impedance of the Doherty power amplifier and the impedance $Z'_L$ may be reduced. On the Smith chart, the impedance of the Doherty circuit draws the arc according to the frequency, and the impedance B also draws the arc according to the frequency. Thus, the difference between the impedance of the Doherty circuit and the impedance $Z'_L$ is reduced. In other words, the Doherty power amplifier may be matched in a wider area by adding the resonance circuit on the transmission line.

Figure 2B:
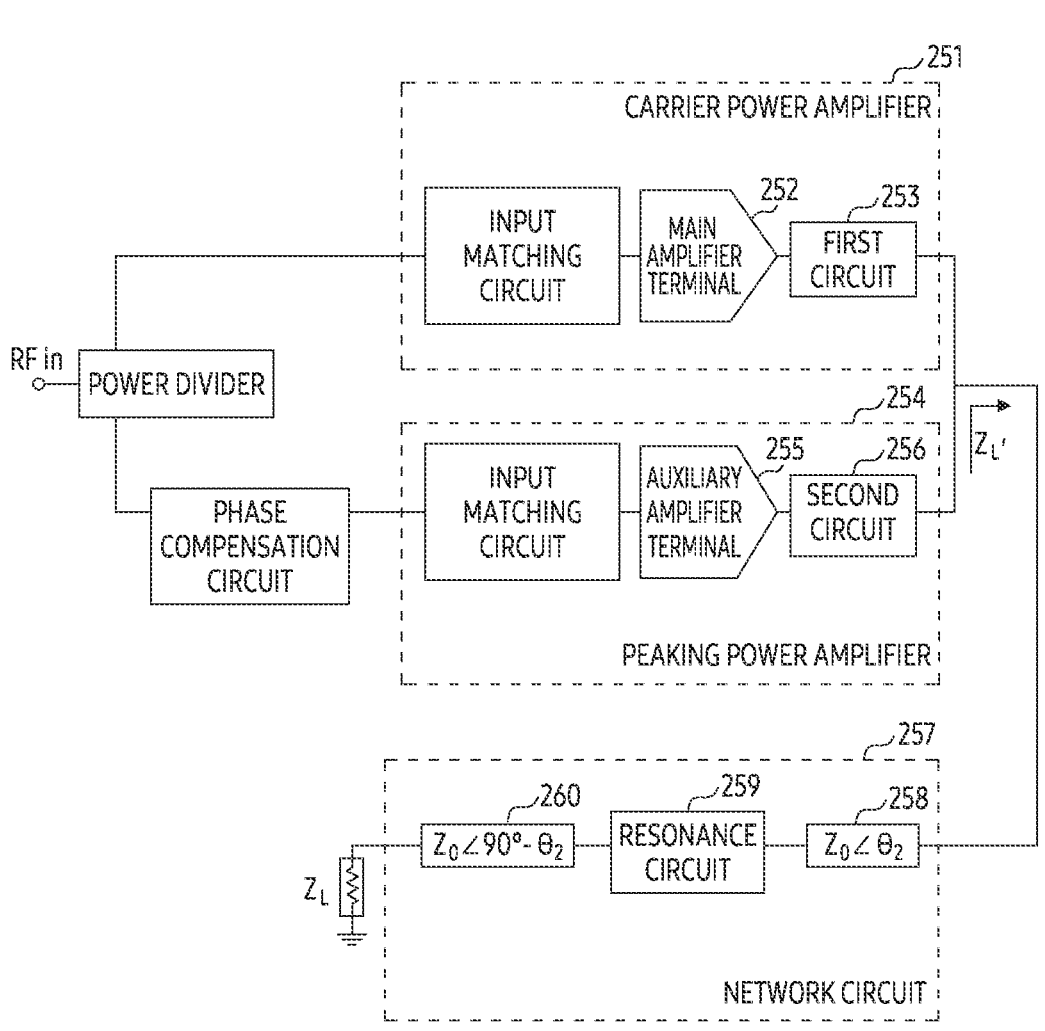
FIG. 2B illustrates an example of a functional configuration of a Doherty power amplifier and a network circuit according to an embodiment of the disclosure.

FIG. 2B illustrates an example of a functional configuration of a Doherty power amplifier and a network circuit according to an embodiment of the disclosure. The network circuit may include a transmission line and resonance circuit for impedance matching. The transmission line may include a first area adjacent to output of the Doherty power amplifier and a second area adjacent to load impedance. The description of the Doherty power amplifier described in FIG. 2A may be applied to the Doherty power amplifier of FIG. 2B in the same manner or a similar manner.

Referring to FIG. 2B, a communication circuit 250 may include the Doherty power amplifier and a network circuit 257. The Doherty power amplifier may include a carrier amplifier 251. The carrier amplifier 251 may include a main amplifier terminal 252 and a first circuit 253 for output matching. The Doherty power amplifier may include a peaking amplifier 254. The peaking amplifier 254 may include an auxiliary amplifier terminal 255 and a second circuit 256 for output matching.

The network circuit 257 may include the resonance circuit and the transmission line. The transmission line may provide phase shift of a designated size (e.g., 90 degrees) for impedance matching. The transmission line may increase the electrical length corresponding to a quarter of the wavelength. The resonance circuit may be disposed in the transmission line. Thus, the transmission line may be divided into two areas. The network circuit 257 may include the first area of the transmission line having the electrical length of $\theta_2$ (hereinafter, a first transmission line 258), a resonance circuit 259, and the second area of the transmission line having the electrical length of 90-$\theta_2$ (hereinafter, a second transmission line 260).

The communication circuit 250 may include the Doherty power amplifier and the network circuit 257 for impedance dispersion coupled to the Doherty power amplifier. Dispersion and rotation of impedance may be controlled as the resonance circuit 259 is inserted between the first transmission line 258 and the second transmission line 260.

The resonance circuit 259 may be implemented in various configurations. According to an embodiment, the resonance circuit 259 may be configured with an open circuit stub and a short circuit stub. According to an embodiment, the resonance circuit 259 may be configured with a series inductor and a series capacitor. According to an embodiment, the resonance circuit 259 may include a parallel inductor and a parallel capacitor. According to an embodiment, the resonance circuit 259 may include the open circuit stub and the parallel inductor. According to an embodiment, the resonance circuit 259 may include the short circuit stub and the parallel capacitor. However, it is not limited to such an embodiment.

The resonance circuit 259 of the network circuit 257 disperses the impedance. Here, the impedance means the impedance ZL' of the network circuit 257 viewed from an output terminal of the Doherty power amplifier (e.g., an output terminal of the first circuit 253 and the second circuit 256) toward a load. Although the resonance circuit 259 does not affect the impedance of the network circuit at the resonance frequency of the resonance circuit 259, the resonance circuit 259 disperses the impedance of the network circuit 257 in a frequency range near the resonance frequency. When the impedance is dispersed, an imaginary value is included in the impedance.

The first transmission line 258 and the second transmission line 260 rotate the dispersed impedance. The first transmission line 258 has characteristic impedance of $Z_0$ and the electrical length of $\theta_2$. The second transmission line 260 has the characteristic impedance of $Z_0$ and the electrical length of 90-$\theta_2$. The network circuit 257 including the first transmission line 258 and the second transmission line 260 may provide phase shift of 90 degrees as a whole.

The impedance of the network circuit is dispersed by the resonance circuit 259 and rotated by the first transmission line 258 and the second transmission line 260. Thus, through impedance change of the resonance circuit 259 according to frequency adjustment and phase adjustment between the first transmission line 258 and the second transmission line 260, the difference between the impedance of the Doherty power amplifier (e.g., impedance facing the Doherty power amplifier) and the impedance of the network circuit 257 may be reduced.

Figure 3:
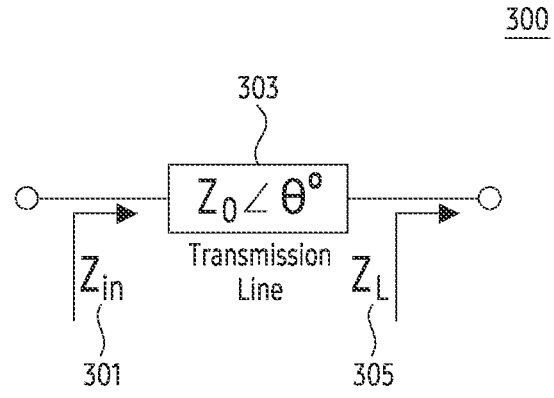
FIG. 3 illustrates an example of impedance rotation on a Smith chart according to an embodiment of the disclosure.
Figure 3:
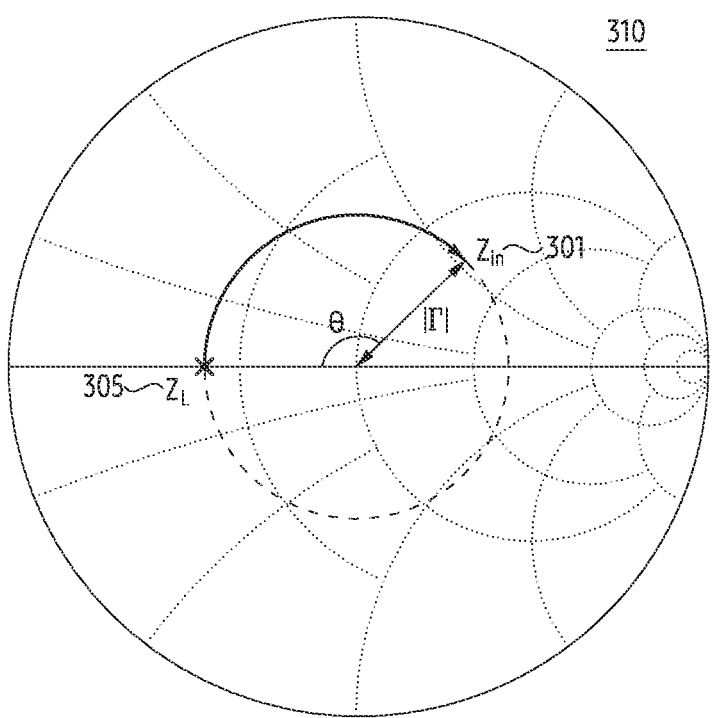

FIG. 3 illustrates an example of impedance rotation on a Smith chart according to an embodiment of the disclosure.

Referring to FIG. 3, a communication circuit 300 may include a transmission line and impedance. An input impedance 301 $Z_{in}$ means impedance in a direction in which a transmission line 303 and a load are viewed from an input terminal of the transmission line. In other words, the input impedance 301 $Z_{in}$ may be an impedance value before passing through the transmission line 303. A load impedance 305 $Z_L$ means impedance in a direction in which the load is viewed from an output terminal of the transmission line. In other words, the load impedance 305 $Z_L$ may be an impedance value after passing through the transmission line 303. The transmission line 303 may have characteristic impedance of $Z_0$ and an electrical length of 0. A Smith chart 310 represents impedance rotation by the transmission line of the communication circuit 300. The input impedance 301 $Z_{in}$ may mean the impedance value before passing through the transmission line, and the load impedance 305 $Z_L$ may mean the impedance value after passing through the transmission line. The input impedance 301 $Z_{in}$ and the load impedance 305 $Z_L$ on the Smith chart 310 is that illustrates the input impedance 301 $Z_{in}$ and the load impedance 305 $Z_L$ on the communication circuit 300 on a Smith chart 310.

The input impedance 301 $Z_{in}$ of the Smith chart 310 may rotate on a circle having a radius of a size |Γ| of a reflection coefficient on a circle where $Z_0$ is the center. The input impedance 301 $Z_{in}$ may rotate counterclockwise by θ on the circle where $Z_0$ is the center by the transmission line 303. In other words, the impedance on a load side may rotate from the input impedance 301 $Z_{in}$ to the load impedance 305 $Z_L$ based on the transmission line 303.

Figure 4:
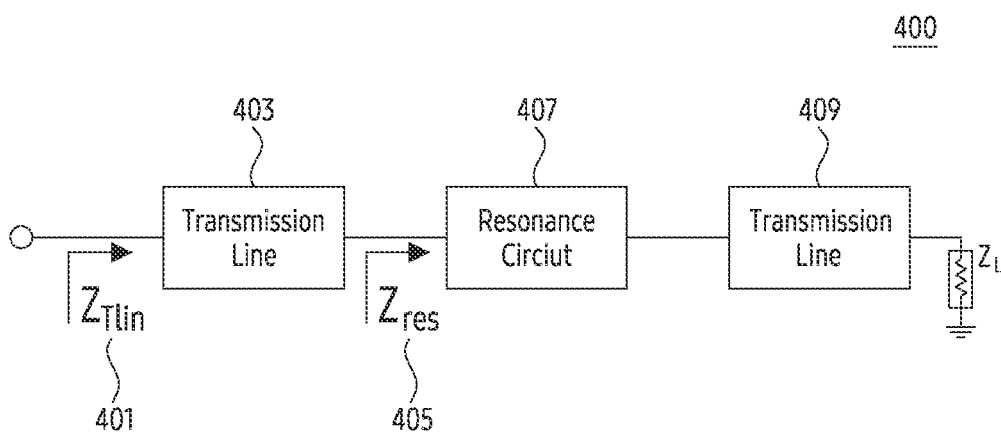
FIG. 4 illustrates an example of impedance rotation and dispersion according to an embodiment of the disclosure.
Figure 4:
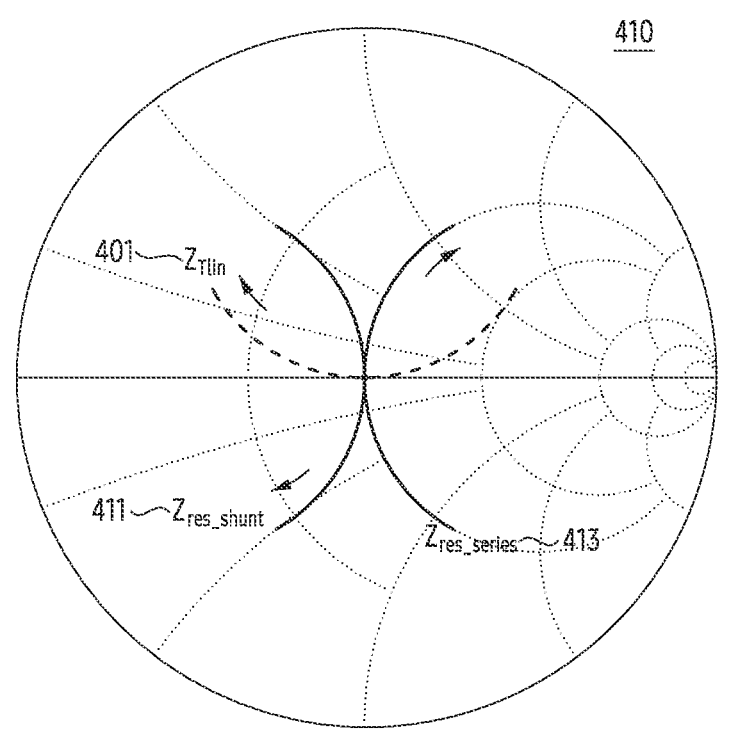

FIG. 4 illustrates an example of impedance rotation and dispersion according to an embodiment of the disclosure.

Referring to FIG. 4, a communication circuit 400 illustrates a network circuit for impedance matching of a Doherty power amplifier. The network circuit may be coupled to an output of the Doherty power amplifier. The communication circuit 400 may include a first transmission line 403, a resonance circuit 407, and a second transmission line 409. A transmission line input impedance 401 $Z_{Tlin}$ means an impedance in a direction facing the first transmission line 403, the resonance circuit 407, the second transmission line 409, and the load impedance, from an input terminal of the first transmission line 403. The first transmission line 403 may be a transmission line having characteristic impedance of $Z_0$ and an electrical length of $θ_2$. A resonance circuit impedance 405 $Z_{res}$ means an impedance in a direction facing the resonance circuit 407, the second transmission line 409, and the load impedance, from an input terminal of the resonance circuit 407. The resonance circuit 407 may disperse the impedance in a range other than the resonance frequency. The second transmission line 409 may be a transmission line having characteristic impedance of $Z_0$ and an electrical length of 90-$θ_2$.

The impedance rotation according to a disposition of the resonance circuit 407 is displayed on a Smith chart 410. The resonance circuit 407 may include a parallel disposition of elements or a series disposition of elements based on a signal transmission direction. The resonance circuit impedance 405 $Z_{res}$ may be dispersed according to a frequency. According to an embodiment, in case that the resonance circuit 407 includes one or more lumped elements connected in parallel, the resonance circuit impedance 405 $Z_{res}$ may be displayed as a parallel resonance circuit impedance 411 $Z_{res-shunt}$ on the Smith chart. According to an embodiment, in case that the resonance circuit 407 includes one or more lumped elements connected in series, the resonance circuit impedance 405 $Z_{res}$ may be displayed as a series resonance circuit impedance 413 $Z_{res-series}$ on the Smith chart 410.

According to an embodiment of the disclosure, the first transmission line may rotate the dispersed impedance on the smith chart 410. Here, the dispersed impedance means the parallel resonance circuit impedance 411 $Z_{res-shunt}$, or the series resonance circuit impedance 413 $Z_{res-series}$ dispersed based on a change in frequency. For example, the transmission line input impedance 401 $Z_{Tlin}$ may be expressed as Equation 2.

$$Z_{Tlin} = Z_0 \frac{Z_{res} + jZ_0 \tan θ_2(f)}{Z_0 + jZ_{res} \tan θ_2(f)} \qquad \text{Equation 2}$$

$$θ_2(f) = k_2(f - f_{20}) + θ_{20} \qquad \text{Equation 3}$$

$θ_2$ may mean an electrical length of the first transmission line 403 at a frequency f. $K_2$ may mean a degree of phase change according to a frequency of the first transmission line 403. $f_{20}$ may mean a center frequency. $θ_{20}$ may mean an electrical length at the center frequency.

The resonance circuit may be configured based on various methods. According to an embodiment of the disclosure, the resonance circuit may be configured through at least one of an open circuit stub and a short circuit stub. According to another embodiment, the resonance circuit may be configured through parallel connection or series connection of lumped elements (e.g., inductor and capacitor). According to still another embodiment, the resonance circuit may be configured through a combination of the lumped element and the stub.

According to an embodiment of the disclosure, the impedance of the resonance circuit configured with the open circuit stub and the short circuit stub may be as shown in Equation 4.

$$Z_{LC} = \frac{1}{jZ_1 \tan θ_1(f) - jZ_1 \cot(90 - θ_1(f))} \qquad \text{Equation 4}$$

$Z_1$ may represent the characteristic impedance of the stub. When the electrical length of the open circuit stub is $θ_1$, the electrical length of the short circuit stub may be 90-$θ_1$. The impedance may be dispersed counterclockwise according to a frequency on the Smith chart 410. The degree of dispersion may be controlled based on the adjustment of $θ_1$, which is the electrical length of the open circuit stub.

According to an embodiment of the disclosure, an impedance value of the resonance circuit configured with a parallel inductor and a parallel capacitor may be as shown in Equation 5.

$$Z_{LC} = \frac{1}{jω_0 L(f)} + jω_0 C(f) \qquad \text{Equation 5}$$

ZLC represents the characteristic impedance of the resonance circuit, L(f) represents an inductance at frequency f, and C(f) represents a capacitance at frequency f. w0 represents each frequency. The dispersion of the impedance may be controlled by adjusting the L value of the inductor and adjusting the C value of the capacitor. In case that the frequency is changed, the resonance circuit may disperse the impedance on a constant resistance circle on the Smith chart 410. According to an embodiment of the disclosure, an impedance value of the resonance circuit configured with a series inductor and a series capacitor may be as shown in Equation 6.

$$Z_{LC} = \frac{1}{j\omega_0 C(f)} + j\omega_0 L(f) \qquad \text{Equation 6}$$

ZLC represents the characteristic impedance of the resonance circuit, L(f) represents the inductance at frequency f, and C(f) represents the capacitance at frequency f. w0 represents each frequency. The dispersion of the impedance may be controlled by adjusting the L value of the inductor and adjusting the C value of the capacitor. In case that the frequency is changed, the resonance circuit may disperse the impedance on the constant resistance circle on the Smith chart 410.

According to an embodiment, the resonance circuit impedance 405 $Z_{res}$ may include the parallel resonance circuit impedance 411 $Z_{res\text{-}shunt}$, which is the impedance of the network circuit with the inductor and the capacitor connected in parallel, and the series resonance circuit impedance 413 $Z_{res\text{-}series}$, which is the impedance which is in case that the inductor and the capacitor are connected in series, depending on a resonance circuit structure. When the frequency is changed, the parallel resonance circuit impedance 411 $Z_{res\text{-}shunt}$ may be dispersed on a constant conductance circle, and the series resonance circuit impedance 413 $Z_{res\text{-}series}$ may be dispersed on the constant resistance circle.

The first transmission line 403 may rotate the impedance. The first transmission line 403 may rotate the trajectory of the parallel resonance circuit impedance 411 $Z_{res\text{-}shunt}$ or the series resonance circuit impedance 413 $Z_{res\text{-}series}$ illustrated in the Smith chart 410 like the transmission line input impedance 401 $Z_{Tlin}$.

Figure 5A:
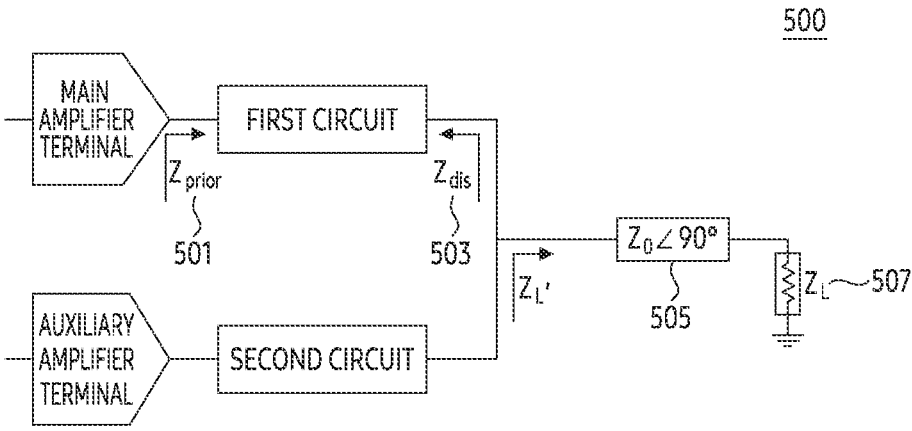
FIG. 5A illustrates an example of impedance of a network circuit according to an embodiment of the disclosure.
Figure 5A:
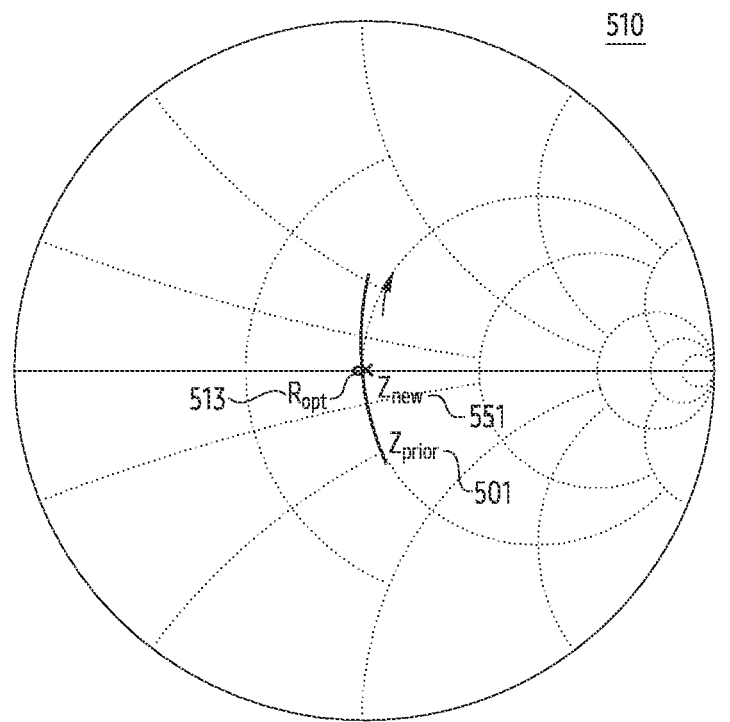

FIG. 5A illustrates an example of impedance of a network circuit according to an embodiment of the disclosure. The network circuit may not include a resonance circuit. The network circuit may include a transmission line for impedance matching.

Figure 5B:
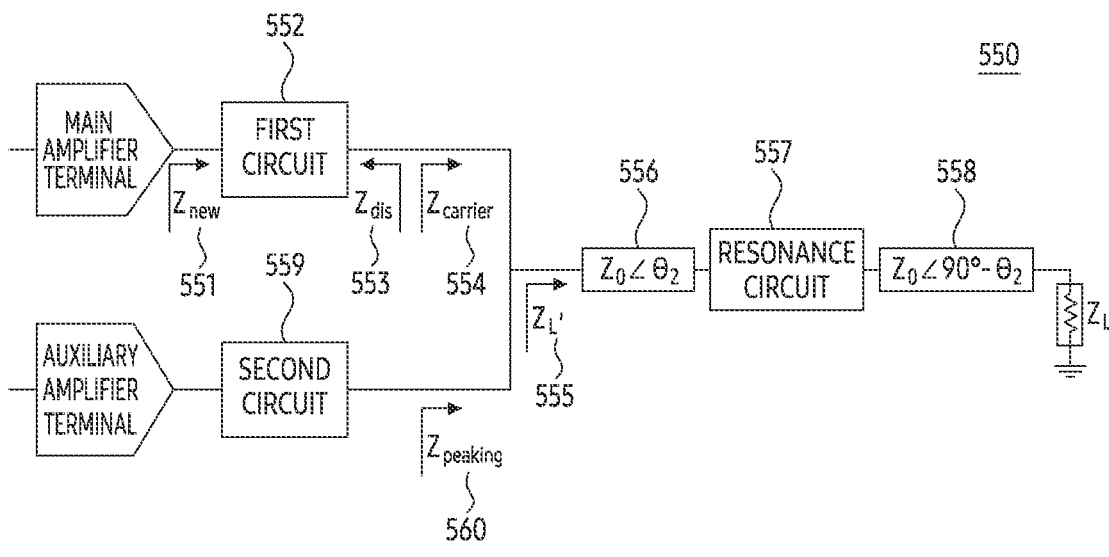
FIG. 5B illustrates an example of impedance of a network circuit according to an embodiment of the disclosure.
Figure 5B:
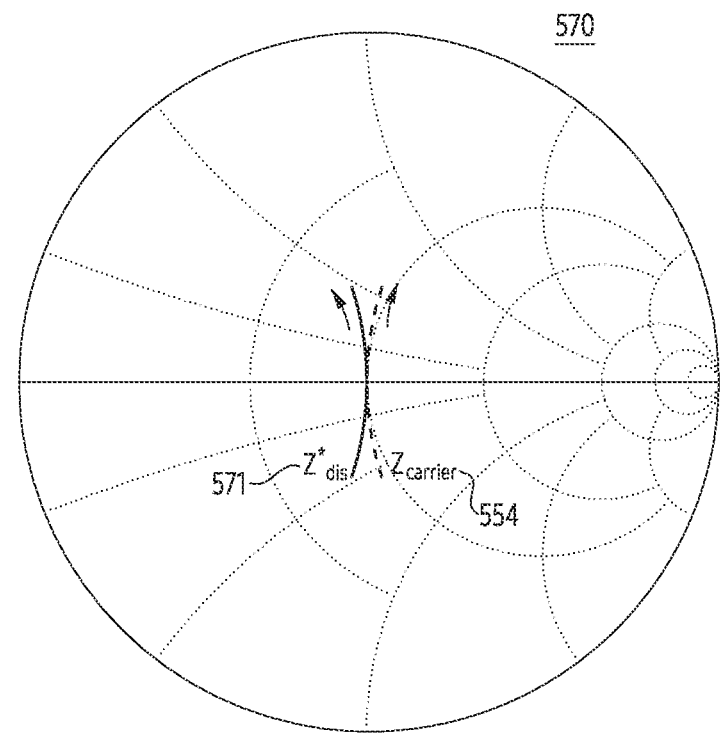

FIG. 5B illustrates an example of impedance of a network circuit including a resonance circuit according to an embodiment of the disclosure. The network circuit may include the resonance circuit and a transmission line for impedance matching. The transmission line may include a first area adjacent to output of a Doherty power amplifier and a second area adjacent to load impedance.

Referring to FIG. 5A, a communication circuit 500 may include the network circuit that does not include the resonance circuit. The network circuit may be coupled to the Doherty power amplifier. In the communication circuit 500, the load impedance 507 $Z_L$ may be matched as an optimum impedance $R_{opt}$. To this end, a transmission line 505 may be connected to the load impedance 507 $Z_L$. Since the network circuit does not include the resonance circuit, the impedance ZL' of the network circuit may have a constant value even if the frequency changes.

The existing impedance 501 $Z_{prior}$ may mean impedance viewed from an input terminal of a first circuit in the communication circuit 500. A distribution impedance 503

$Z_{dis}$ may mean impedance facing the main amplifier terminal from an output terminal of the first circuit in the communication circuit 500. The network circuit may include the transmission line 505 and the load impedance 507 $Z_L$. For example, an element corresponding to an antenna corresponds to the load impedance $Z_L$. The optimum impedance $R_{opt}$ value 513 may mean an impedance value of the network circuit to be matched.

Referring to FIG. 5B, a communication circuit 550 may include a network circuit including a resonance circuit 557. The network circuit may be coupled to the Doherty power amplifier. The network circuit may be coupled to the load impedance $Z_L$. The network circuit may include a first transmission line 556, the resonance circuit 557, and a second transmission line 558. Since the network circuit includes the resonance circuit 557, a value of impedance 555 $Z'_L$ of the network circuit may vary according to a change in the frequency.

The new impedance 551 $Z_{new}$ may mean characteristic impedance facing a first circuit 552 for matching from the main amplifier terminal for matching. A distribution impedance 553 $Z_{dis}$ may mean characteristic impedance facing the first circuit 552 from the network circuit. A carrier impedance 554 $Z_{carrier}$ may mean characteristic impedance facing the network circuit from the first circuit 552. The network impedance 555 $Z'_L$ may mean characteristic impedance facing the network circuit from an output terminal of the Doherty power amplifier. The network circuit may include the transmission line 556, the resonance circuit 557, the transmission line 558, and the load impedance $Z_L$. In a peaking amplifier, a second circuit 559 is for output matching. The peaking impedance 560 $Z_{peaking}$ may mean characteristic impedance facing the network circuit from the second circuit 559.

A conjugate distribution impedance 571 $Z_{dis}^*$ may be conjugate impedance of the distribution impedance 553 $Z_{dis}$. The conjugate distribution impedance 571 $Z_{dis}^*$ may be dispersed according to the frequency, as illustrated in a Smith chart 570.

In the Smith chart 510, due to a characteristic of a matching circuit, the existing impedance 501 $Z_{prior}$ is dispersed by a degree of mismatch between dispersion of a conjugated complex number $Z^*_{dis}$ of a dispersed impedance 503 $Z_{dis}$ and the network impedance $Z'_L$, and matching loss occurs.

In case that an existing impedance 511 $Z_{prior}$ is dispersed, the existing impedance 511 $Z_{prior}$ may become different from an optimal impedance $R_{opt}$ value 513, and thus the matching loss may occur. Due to this matching loss, performance of the Doherty power amplifier may become different from a design goal.

The distribution impedance 553 $Z_{dis}$ and the carrier impedance 554 $Z_{carrier}$ may be determined by a current ratio f between a carrier amplifier and the peaking amplifier and a current phase difference between the carrier amplifier and the peaking amplifier at a coupling point. This is expressed as equation as follows. $\Delta\theta(f)$ has a value obtained by subtracting the current phase of the main amplifier from the current phase of an auxiliary amplifier at a center frequency, and may be a variable modeled as a linear function depending on the frequency.

$$\Delta\theta(f) = \theta_P(f) - \theta_C(f) = k_3(f - f_0) + \theta_{30} \qquad \text{Equation 7}$$

$$Z_{carrier} = \left(1 + \frac{1}{\beta e^{\Delta\theta(f)}}\right) Z'_L \qquad \text{Equation 8}$$

$$Z_{peaking} = \left(1 + \beta e^{\Delta\theta(f)}\right) Z'_L \qquad \text{Equation 9}$$

According to an embodiment of the disclosure, in case that the conjugate distribution impedance $Z^*_{dis}$ is dispersed with respect to the frequency, in order to solve the matching loss between the conjugate distribution impedance $Z^*_{dis}$ and the optimal impedance $R_{opt}$, frequency-dependent characteristic impedance needs to be provided. A rotating network circuit according to embodiments of the disclosure may provide the carrier impedance $Z_{carrier}$ that is dispersed clockwise according to the frequency.

Figure 6:
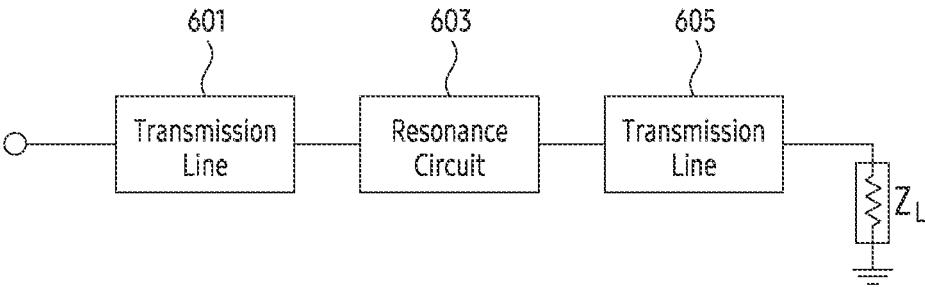
FIG. 6 illustrates a functional configuration of a network circuit configured with a transmission line and a resonance circuit according to an embodiment of the disclosure.

FIG. 6 illustrates a functional configuration of a network circuit configured with a transmission line and a resonance circuit according to an embodiment of the disclosure.

Referring to FIG. 6, a first transmission line block 601 is the transmission line having an electrical length. A resonance circuit block 603 is a resonance circuit that disperses impedance. A second transmission line block 605 is the transmission line having the electrical length. Hereinafter, detailed examples of the first transmission line block 601 or the second transmission line block 605 are described through FIG. 7. Hereinafter, detailed examples of the resonance circuit block 603 are described through FIGS. 8A, 8B, and 9.

Figure 7:
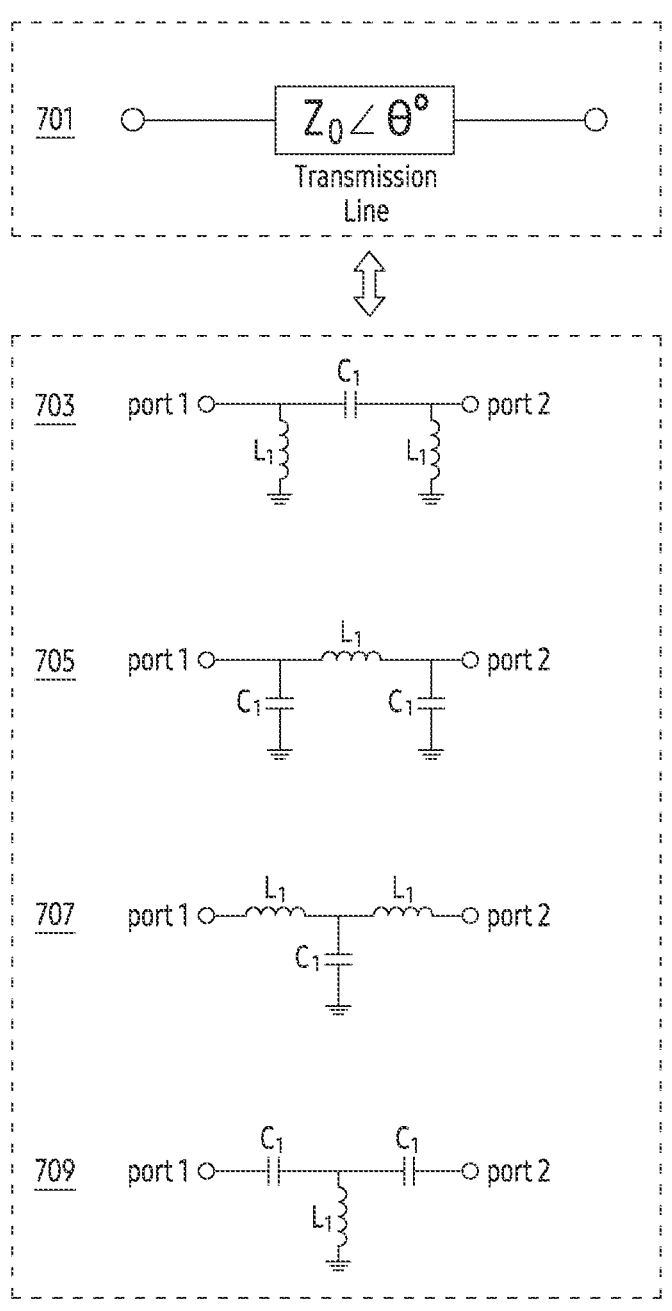
FIG. 7 illustrates an example of a transmission line included in a network circuit according to an embodiment of the disclosure.

FIG. 7 illustrates an example of a transmission line included in a network circuit according to an embodiment of the disclosure.

Referring to FIG. 7, a communication circuit 700 illustrates examples of the transmission line. A transmission line 701 may be the transmission line having characteristic impedance of $Z_0$ and an electrical length of $\theta$.

According to an embodiment, a transmission line structure 703 may mean a low-frequency pass filter structure implemented as an equivalent circuit in the form of an π-network. In other words, the transmission line structure 703 may be an L-C-L filter in the form of the π-network. The transmission line structure 703 may include one capacitor and two inductors.

According to an embodiment, a transmission line structure 705 may mean a high-frequency pass filter structure implemented as the equivalent circuit in the form of the π-network. In other words, the transmission line structure 705 may be a C-L-C filter in the form of the π-network. The transmission line structure 705 may include one inductor and two capacitors.

According to an embodiment, a transmission line structure 707 may mean a low-frequency pass filter structure implemented as an equivalent circuit in the form of a T-network. In other words, the transmission line structure 707 may be an L-C-L filter in the form of a T-network. The transmission line structure 707 may include one capacitor and two inductors.

According to an embodiment, a transmission line structure 709 may mean a high-frequency pass filter structure implemented as an equivalent circuit in the form of the T-network. In other words, the transmission line structure 709 may be a C-L-C filter in the form of the T-network. The transmission line structure 709 may include one capacitor and two inductors.

According to an embodiment, in case that the transmission line 701 is implemented through lumped elements (e.g., inductor, capacitor) as in the above-described equivalent circuit diagram, at least some of the lumped elements may be merged with the lumped element of another block (e.g., a resonance circuit block 603 of FIG. 6). Through merging, the implementation of the circuit may be simplified.

Figure 8A:
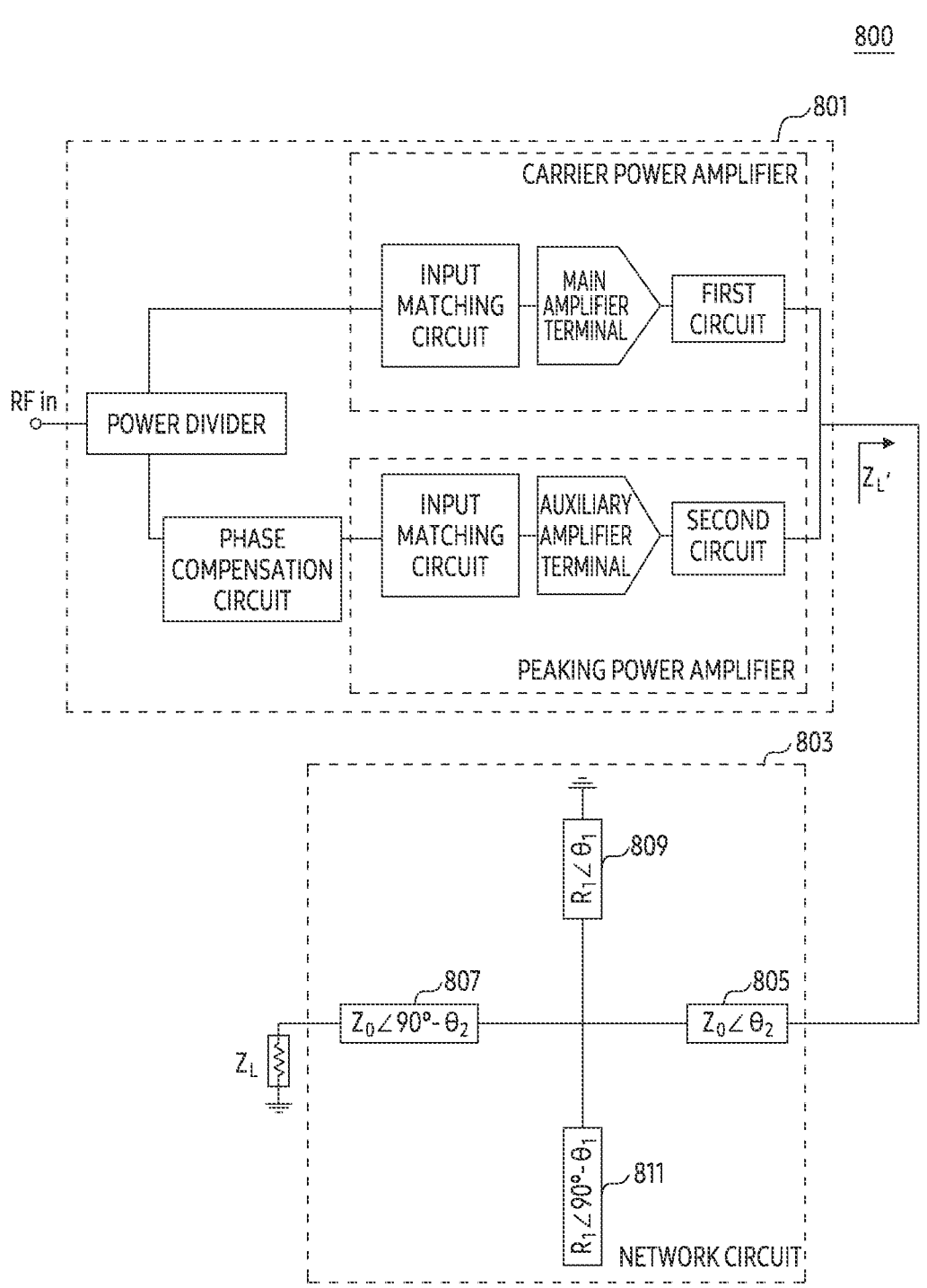
FIG. 8A illustrates an example of a Doherty power amplifier circuit including a resonance circuit using a stub according to an embodiment of the disclosure.

FIG. 8A illustrates an example of a Doherty power amplifier circuit including a resonance circuit using a stub according to an embodiment of the disclosure.

Referring to FIG. 8A, a communication circuit 800 may include a Doherty power amplifier 801 and a network circuit 803 for impedance matching. The description of the Doherty power amplifier described through FIGS. 2A, 2B, 5A, and 5B may be applied to the Doherty power amplifier 801 in the same or similar manner. When impedance matching for band expansion of the Doherty power amplifier 801, the network circuit 803 may be used. The network circuit 803 may include a transmission line 805, the resonance circuit, and a transmission line 807. The resonance circuit of the network circuit 803 may include a short circuit 809 and an open circuit 811.

The resonance circuit may include the short circuit 809 having characteristic impedance of $R_1$ and an electrical length of $\theta_1$, and the open circuit 811 having the characteristic impedance of $R_1$ and an electrical length of 90-θ1. The transmission line 805 may have characteristic impedance of $Z_0$ and an electrical length of $\theta_2$. The transmission line 807 may have the characteristic impedance of $Z_0$ and an electrical length of 90-$\theta_2$.

Figure 8B:
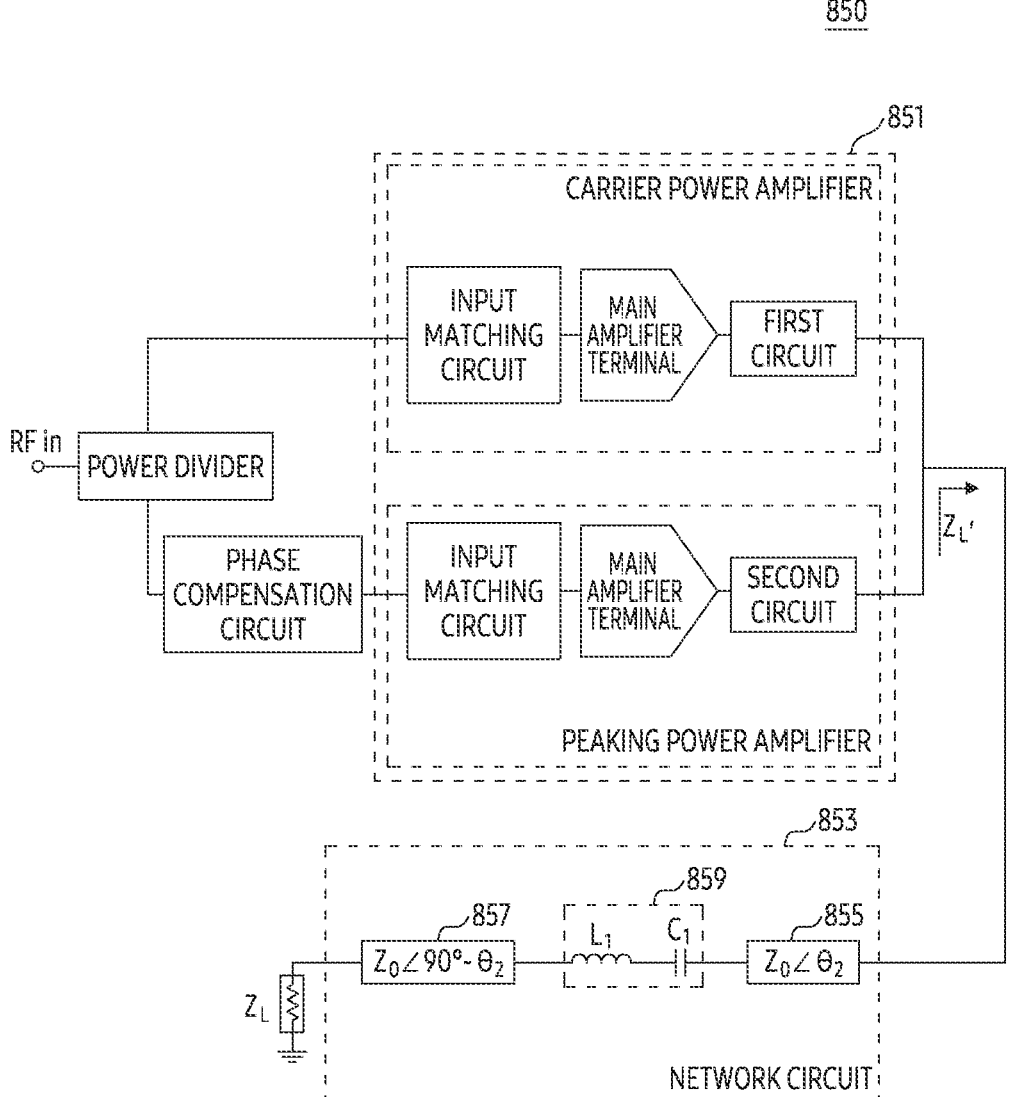
FIG. 8B illustrates an example of a Doherty power amplifier circuit including a resonance circuit using a lumped element according to an embodiment of the disclosure.

FIG. 8B illustrates an example of a Doherty power amplifier circuit including a resonance circuit using a lumped element according to an embodiment of the disclosure.

Referring to FIG. 8B, a communication circuit 850 may include a Doherty power amplifier 851 and a network circuit 853 for impedance matching. The description of the Doherty power amplifier described through FIGS. 2A, 2B, 5A, and 5B may be applied to the Doherty power amplifier 851 in the same or similar manner.

When impedance matching for band expansion of the Doherty power amplifier 851, the network circuit 853 may be used. The network circuit 853 may include a transmission line 855, a resonance circuit 859, and a transmission line 857. The resonance circuit 859 of the network circuit 853 may include lumped elements. According to an embodiment, the resonance circuit 859 may include lumped elements. According to an embodiment, the resonance circuit 859 may include an inductor and a capacitor connected in series. The transmission line 855 may have characteristic impedance of $Z_0$ and an electrical length of $\theta_2$. The transmission line 857 may have the characteristic impedance of $Z_0$ and an electrical length of 90-$\theta_2$.

Figure 9:
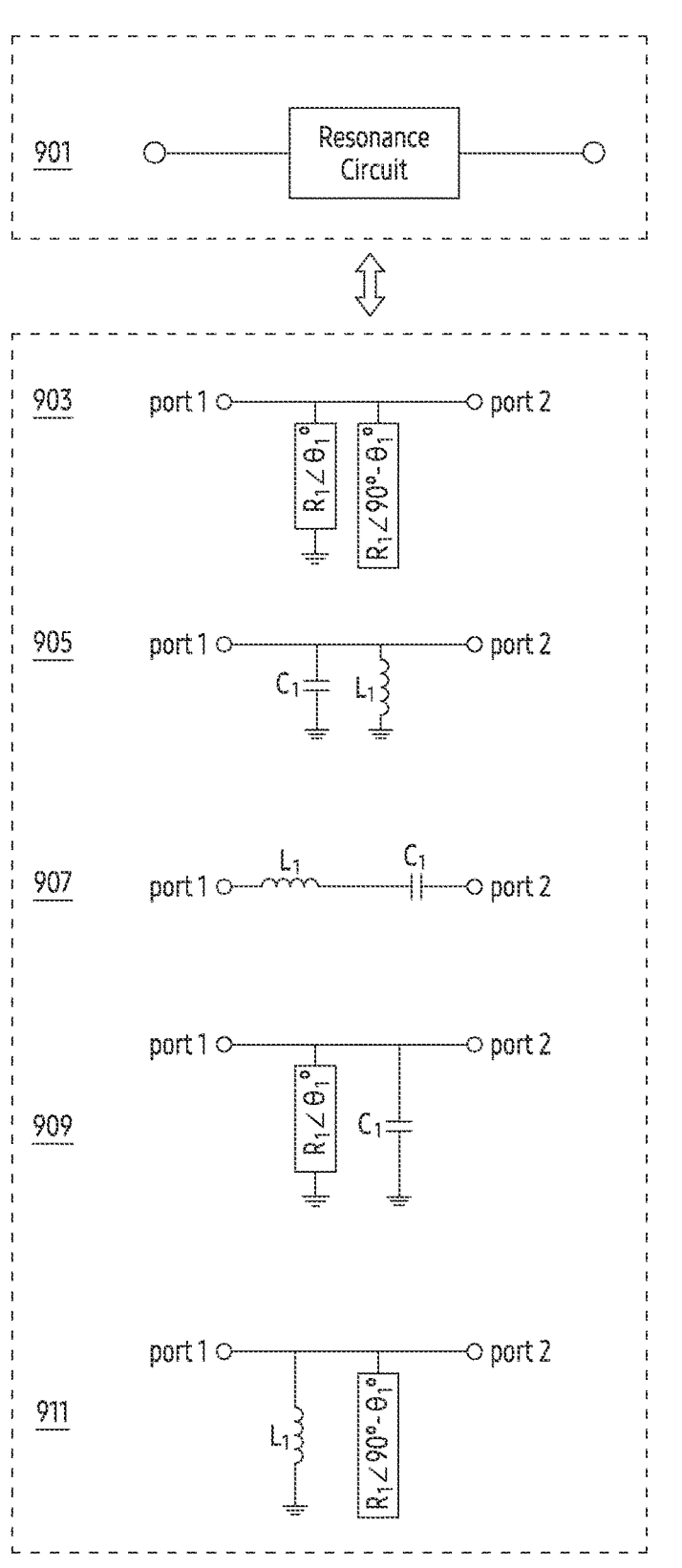
FIG. 9 illustrates an example of a resonance circuit included in a network circuit according to an embodiment of the disclosure.

FIG. 9 illustrates an example of a resonance circuit included in a network circuit according to an embodiment of the disclosure.

Referring to FIG. 9, a communication circuit 900 illustrates examples of a resonance circuit. The resonance circuit 901 means a circuit having a frequency selective characteristic. Since difference between an inductive component and a capacitive component of the resonance circuit 901 at the resonance frequency is balanced, resonance may occur in the resonance circuit 901.

According to an embodiment, a resonance circuit structure 903 may have a structure in which a short circuit stub and an open circuit stub are connected in parallel. The short circuit stub R1∠θ1 and the open circuit stub R1∠90-θ1 may be disposed in parallel between an input port (e.g., port 1) and an output port (e.g., port 2).

The resonance circuit structure 903 may have a structure in which the short circuit stub having characteristic impedance of $R_1$ and an electrical length of $\theta_1$ is connected in parallel with the open circuit stub having the characteristic impedance of $R_1$ and an electrical length of 90-$\theta_1$. As described above, impedance $Z_{LC}$ of the resonance circuit configured with the short circuit stub and the open circuit stub is equal to Equation 4.

In Equation 4, $\theta_1$ may be expressed as Equation 10.

$$\theta_1(f) = k_1(f - f_{10}) + \theta_{10} \qquad \text{Equation 10}$$

$\theta_1$ may mean an electrical length of a transmission line. $k_1$ may mean a degree of phase change according to a frequency of the transmission line. $f_{10}$ may mean a center frequency. $\theta_{10}$ may mean the electrical length at the center frequency.

According to an embodiment, a resonance circuit structure 905 may be a structure in which an inductor and a capacitor are connected in parallel. An inductor L1 may be disposed in parallel between the input port (e.g., port 1) and the output port (e.g., port 2). A capacitor C1 may be disposed in parallel between the input port (e.g., port 1) and the output port (e.g., port 2). For example, the impedance $Z_{LC}$ of the resonance circuit may be referred to Equation 5 described above.

According to an embodiment, a resonance circuit structure 907 may be a structure in which the inductor and the capacitor are connected in series. The inductor L1 may be disposed in series between the input port (e.g., port 1) and the output port (e.g., port 2). For example, the impedance $Z_{LC}$ of the resonance circuit may be referred to Equation 6 described above.

According to an embodiment, a resonance circuit structure 909 may have a structure in which the short circuit stub that rotates an impedance like the inductor are connected in parallel with a capacitor. The short circuit stub R1∠θ1 may be disposed in parallel between the input port (e.g., port 1) and the output port (e.g., port 2). The short circuit stub may provide an inductive load. The capacitor C1 may be disposed in parallel between the input port (e.g., port 1) and the output port (e.g., port 2).

According to an embodiment, a resonance circuit structure 911 may have a structure in which the open circuit stub that rotate impedance like the capacitor are connected in parallel with the inductor. The inductor L1 may be disposed in parallel between the input port (e.g., port 1) and the output port (e.g., port 2). The open circuit stub R1∠90-θ1 may be disposed in parallel between the input port (e.g., port 1) and the output port (e.g., port 2). The open circuit stub may provide a capacitive load.

According to an embodiment, in case that the transmission line is implemented through lumped elements (e.g., inductor, capacitor) like the above-described equivalent circuits, at least some of the lumped elements may be merged with lumped elements of another block (e.g., a first transmission line block 601 of FIG. 6). Through merging, the implementation of the circuit may be simplified.

Figure 10A:
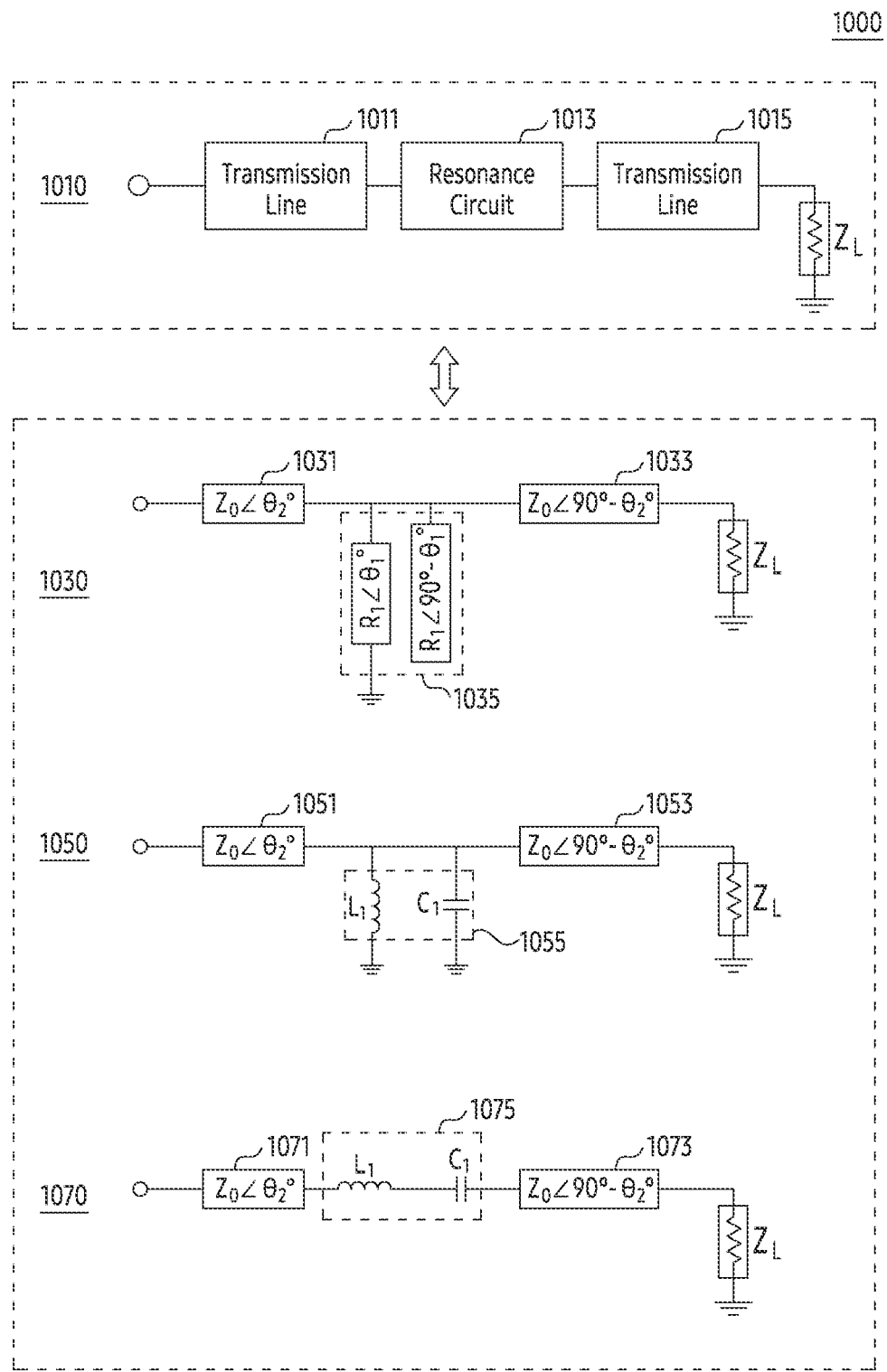
FIG. 10A illustrates an example of a network circuit including a transmission line and a resonance circuit according to an embodiment of the disclosure.

FIG. 10A illustrates an example of a network circuit including a transmission line and a resonance circuit according to an embodiment of the disclosure.

Referring to FIG. 10A, a communication circuit 1000 illustrates examples of the network circuit. A communication circuit 1010 illustrates the network circuit configured with a first transmission line 1011, a resonance circuit 1013, a second transmission line 1015, and a load impedance $Z_L$.

According to an embodiment, a network circuit structure 1030 illustrates the network circuit including a first transmission line 1031, a resonance circuit 1035 including a short circuit stub, an open circuit stub, and a second transmission line 1033. The short circuit stub R1∠θ1 and the open circuit stub R1∠90-θ1 may be disposed in parallel between the first transmission line 1031 and the second transmission line 1033.

Structure of the resonance circuit 1035 may be a structure in which the short circuit stub having a characteristic impedance of $R_1$ and an electrical length of $\theta_1$ is connected in parallel with an open circuit stub having the characteristic impedance of $R_1$ and an electrical length of 90-$\theta_1$. As described above, the impedance $Z_{LC}$ of the resonance circuit configured with the short circuit stub and the open circuit stub is equal to Equation 4.

According to an embodiment, a network circuit structure 1050 illustrates the network circuit including a first transmission line 1051, a resonance circuit 1055 in which an inductor and a capacitor are connected in parallel, and a second transmission line 1053. An inductor L1 may be disposed in parallel between the first transmission line 1051 and the second transmission line 1053. A capacitor C1 may be disposed in parallel between the first transmission line 1051 and the second transmission line 1053. For example, the impedance $Z_{LC}$ of the resonance circuit may be referred to Equation 5 described above.

According to an embodiment, a network circuit structure 1070 illustrates the network circuit including a first transmission line 1071, a resonance circuit 1075 in which the inductor and the capacitor are connected in series, and a second transmission line 1073. An inductor L1 may be disposed in series between the first transmission line 1071 and the second transmission line 1073. A capacitor C1 may be disposed in series between the first transmission line 1071 and the second transmission line 1073. For example, the impedance $Z_{LC}$ of the resonance circuit may be referred to Equation 6 described above.

In FIG. 10A, the position of the resonance circuit disposed on the transmission line is constant and the $\theta_2$ value is illustrated as being constant, but embodiments of the disclosure are not limited thereto. In case that the resonant circuit is configured with the lumped element, as the position of the resonance circuit on the transmission line having the electrical length of 90 degrees is changed, the $\theta_2$ value of the transmission line may be changed. In this case, the $\theta_2$ value may be determined through simulation so that the matching is the best.

Figure 10B:
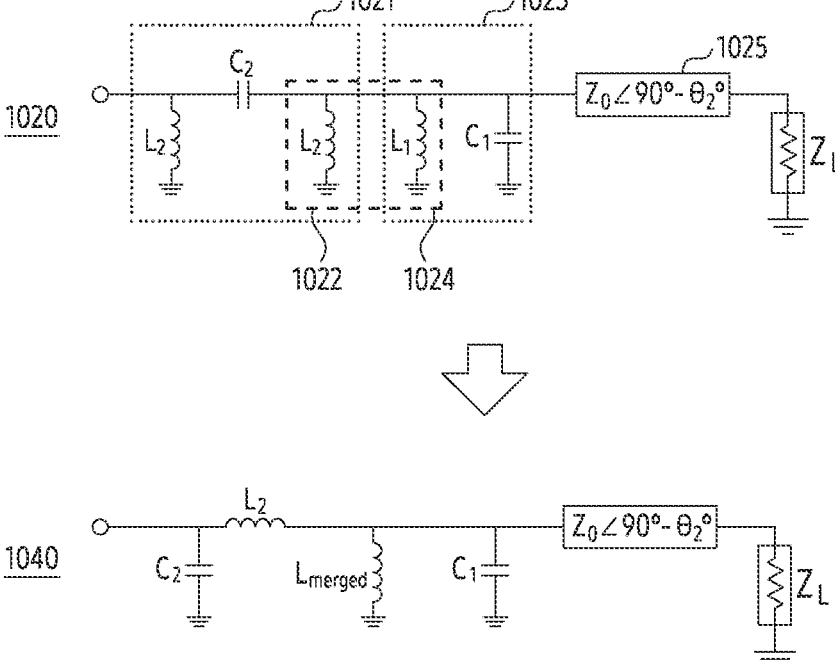
FIG. 10B is an equivalent circuit diagram in which some lumped element among an equivalent circuit of a transmission line and some lumped element among an equivalent circuit of a resonance circuit are combined in a network circuit according to an embodiment of the disclosure.

FIG. 10B is an equivalent circuit diagram in which some lumped element among an equivalent circuit of a transmission line and some lumped element among an equivalent circuit of a resonance circuit are combined in a network circuit according to an embodiment of the disclosure.

Referring to FIG. 10B, a circuit diagram 1020 of the network circuit may include a first transmission line 1021, a resonance circuit 1023, a second transmission line 1025, and a load impedance $Z_L$. The first transmission line 1021 may be an L-C-L filter in the form of an π-network. The resonance circuit 1023 may be configured with a resonance circuit structure 905 in which an inductor and a capacitor are connected in parallel. In a circuit diagram 1040, which is the equivalent circuit diagram to the circuit diagram 1020, component of an inductor 1022 and an inductor 1024 may be combined to be configured with one inductor. When the network circuit is implemented using only the lumped element, the circuit structure may be simplified by using an appropriate structure of the transmission line and a resonant circuit.

Although not illustrated in FIG. 10B, in the resonance circuit, a circuit in which the inductor and the capacitor are connected in series may be the equivalent circuit to a circuit in which the inductor and the capacitor are connected in parallel and the transmission line having an electrical length of 90 degrees is added. Thus, according to the selection of the structure of the resonance circuit, the degree of dispersion and rotation of the impedance may be controlled without adding a separate transmission line.

Figure 11:
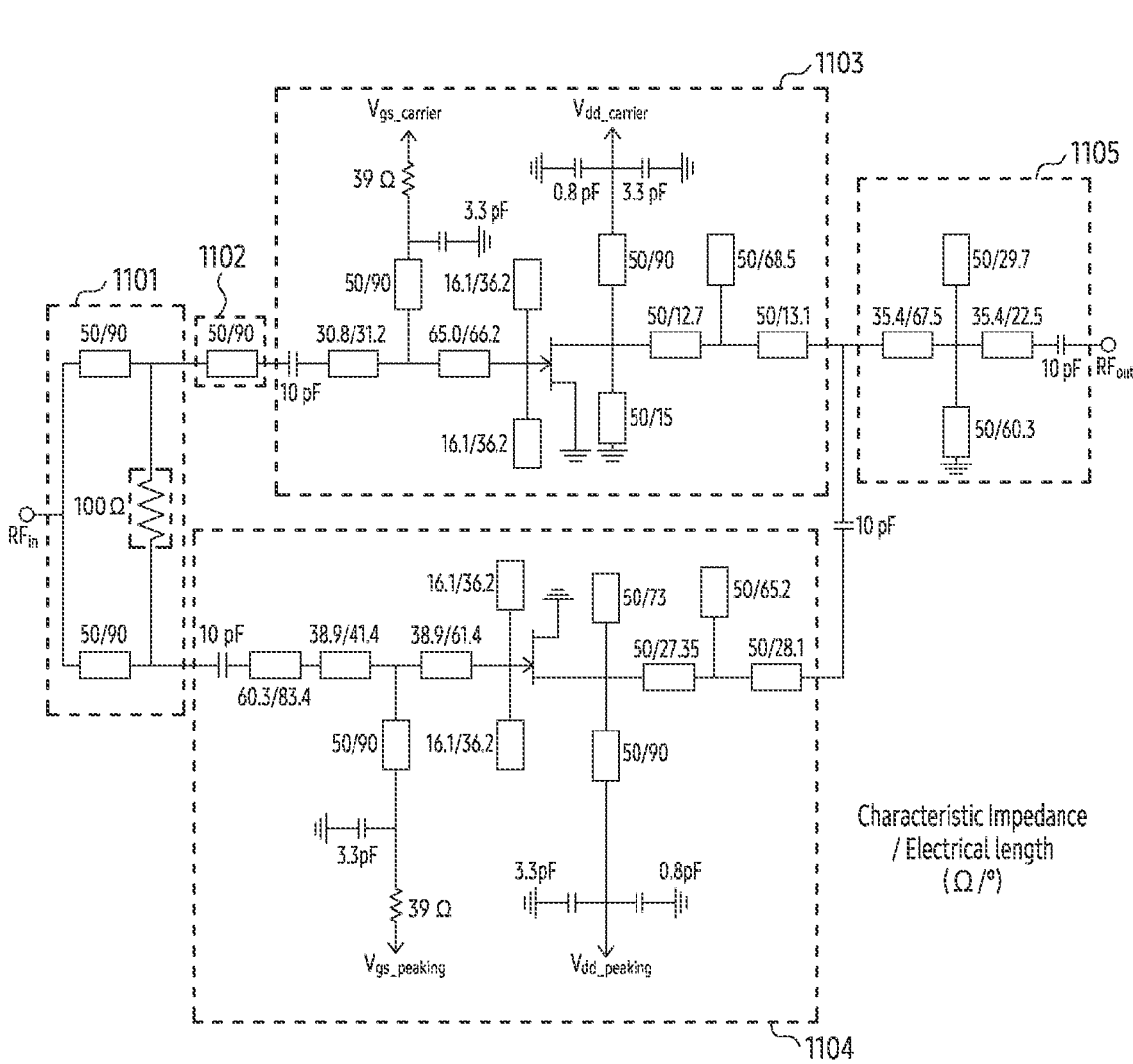
FIG. 11 illustrates an example of a Doherty power amplifier and a network circuit according to an embodiment of the disclosure.

FIG. 11 illustrates an example of a Doherty power amplifier and a network circuit according to an embodiment of the disclosure.

Referring to FIG. 11, a communication circuit 1100 illustrates the Doherty power amplifier and the network circuit. A circuit portion 1101 may mean a power divider. A circuit portion 1102 may mean a phase compensation circuit. A circuit portion 1103 may mean a carrier amplifier. A circuit portion 1104 may mean a peaking amplifier. A circuit portion 1105 may mean the network circuit. A design frequency band of the communication circuit 1100 is 3.4-3.8 GHz. Hereinafter, in FIGS. 12A, 12B, 13A, 13B, and 13C, it may be confirmed whether the performance of the amplifier is improved based on whether the disclosure is implemented.

Figure 12A:
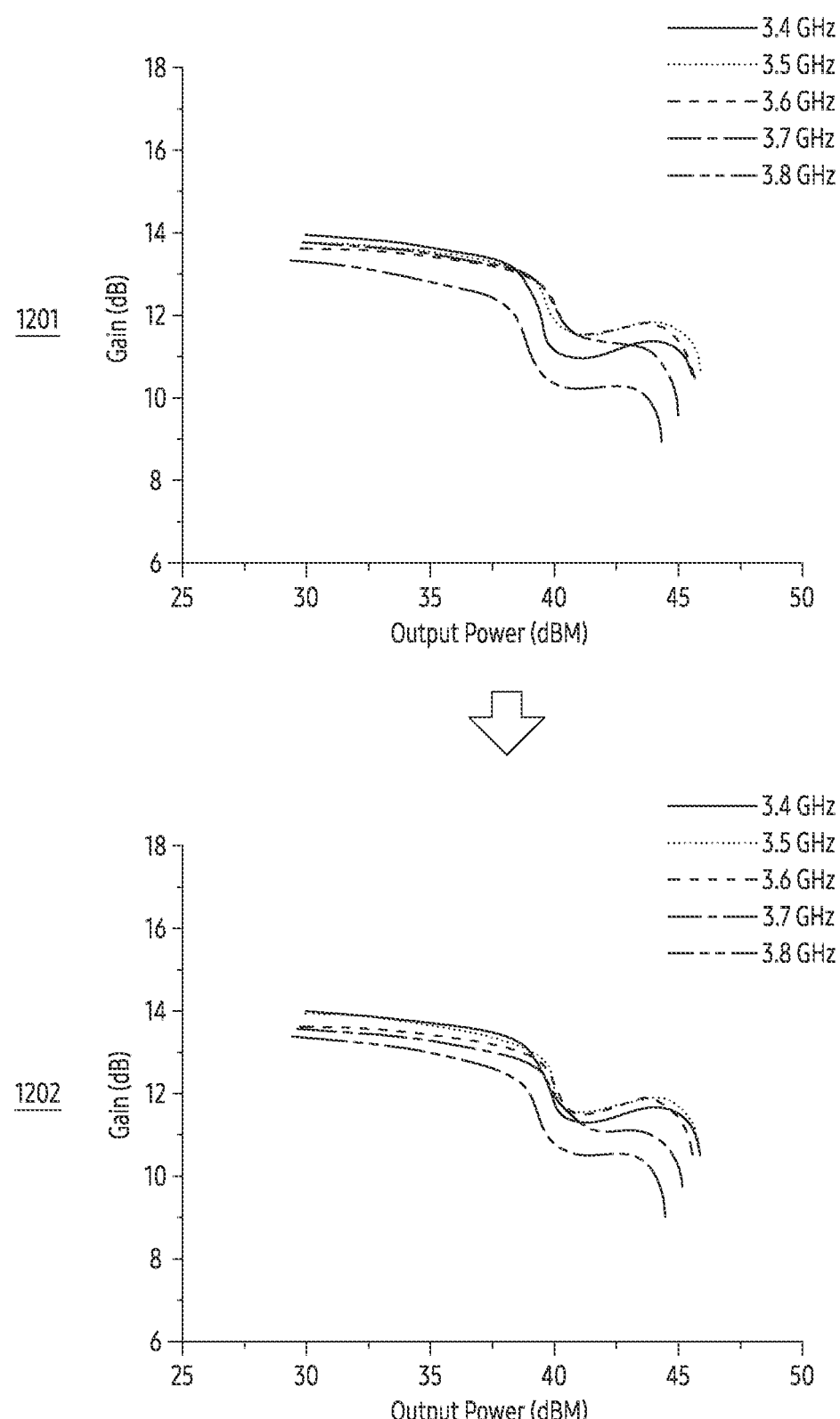
FIG. 12A illustrates an effect of improving a power gain of a Doherty power amplifier through a network structure according to an embodiment of the disclosure.

FIG. 12A illustrates an effect of improving a power gain of a Doherty power amplifier through a network structure according to an embodiment of the disclosure.

Referring to FIG. 12A, a graph 1201 represents a gain value of the Doherty power amplifier coupled to a transmission line for impedance matching. The graph 1201 may represent the power gain for five frequencies at intervals of 100 MHz from 3.4 GHz to 3.8 GHz in the Doherty power amplifier. A horizontal axis of the graph 1201 represents output power (unit: decibel milliwatt (dBm)), and a vertical axis of the graph 1201 represents gain (unit: decibel (dB)).

A graph 1202 represents gain performance of the Doherty power amplifier coupled to a network circuit for rotation of dispersed impedance according to an embodiment of the disclosure. The graph 1202 may represent the power gain for five frequencies at intervals of 100 MHz from 3.4 GHz to 3.8 GHz in the Doherty power amplifier.

In the graph 1202, it is confirmed that the power gain has increased overall in a certain frequency band (e.g., 3.4 GHz to 3.7 GHz). As the overall gain increases, the range of a serviceable frequency band increases. Through the network circuit for rotation of the dispersed impedance, the Doherty power amplifier may support broadband.

Figure 12B:
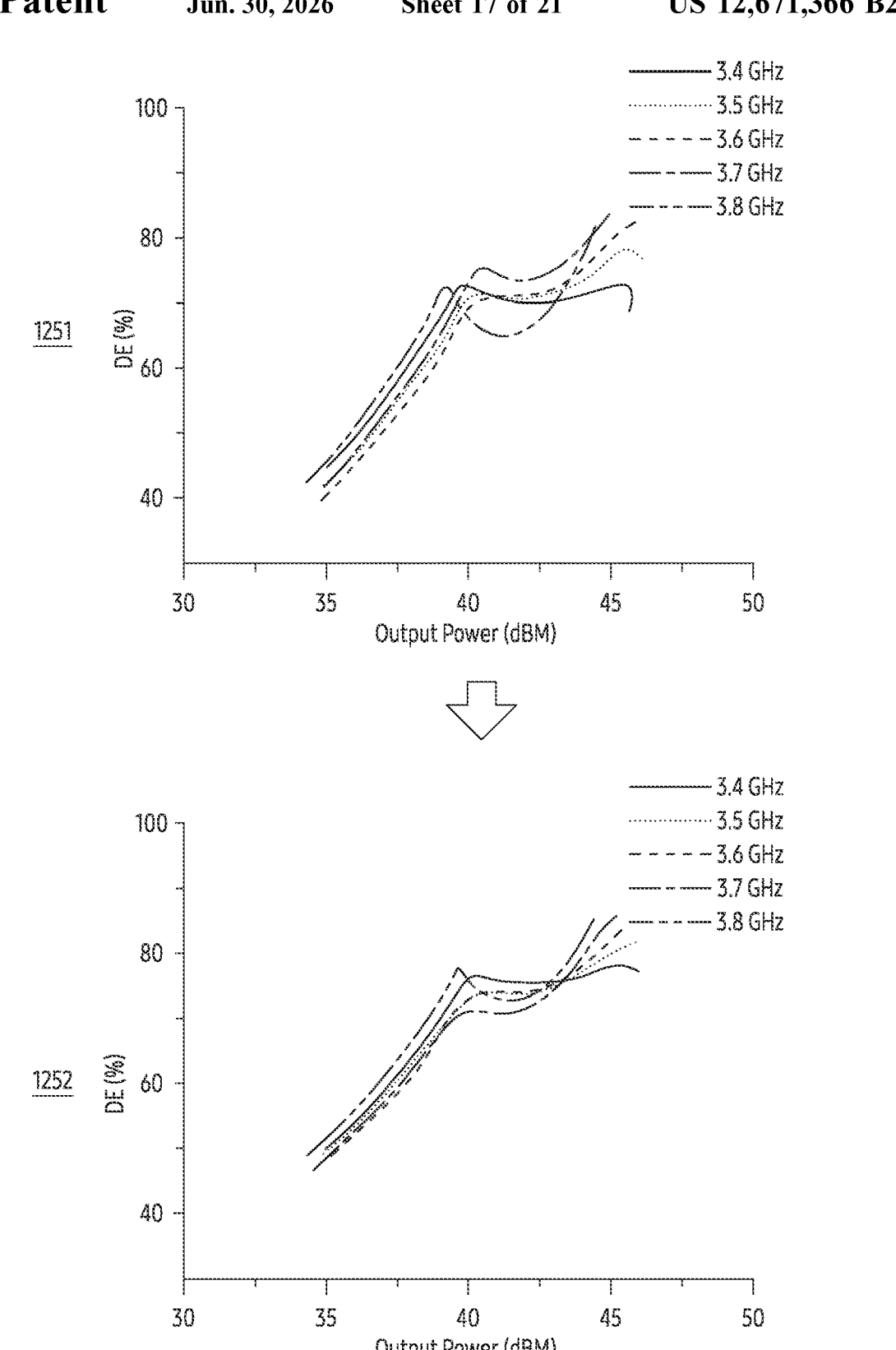
FIG. 12B illustrates an effect of improving drain efficiency of a Doherty power amplifier through a network structure according to an embodiment of the disclosure.

FIG. 12B illustrates an effect of improving drain efficiency of a Doherty power amplifier through a network structure according to an embodiment of the disclosure.

Referring to FIG. 12B, a graph 1251 represents a drain efficiency value of the Doherty power amplifier coupled to a transmission line for impedance matching. The graph 1251 may represent the drain efficiency value for five frequencies at intervals of 100 MHz from 3.4 GHz to 3.8 GHz in the Doherty power amplifier. A horizontal axis of the graph 1251 represents output power (unit: decibel milliwatt (dBm)), and a vertical axis of the graph 1251 represents the drain efficiency (unit: percentage (%)).

A graph 1252 represents the drain efficiency value of the Doherty power amplifier coupled to a network circuit for rotation of dispersed impedance according to an embodiment of the disclosure. The graph 1252 may represent the drain efficiency value for five frequencies at intervals of 100 MHz from 3.4 GHz to 3.8 GHz in the Doherty power amplifier. The horizontal axis of the graph 1252 represents the output power (unit: decibel milliwatt (dBm)), and the vertical axis of the graph 1252 represents the drain efficiency (unit: percentage (%)).

In the graph 1252, it may be confirmed that the overall drain efficiency is increased.

Figure 13A:
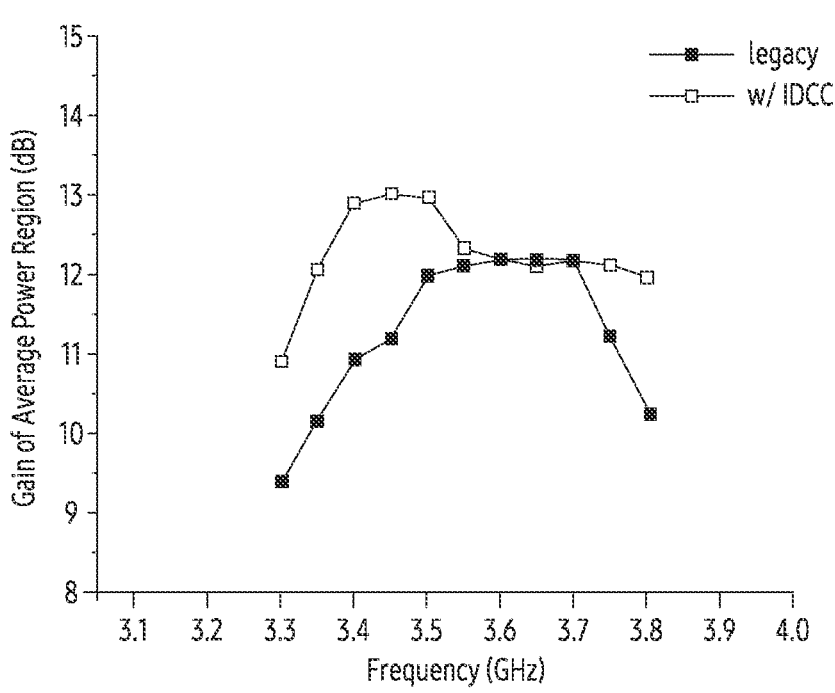
FIG. 13A illustrates an example of a power gain of a Doherty power amplifier in an average power area for each frequency based on whether a network circuit is added according to an embodiment of the disclosure.

FIG. 13A illustrates an example of a power gain of a Doherty power amplifier in an average power area for each frequency based on whether a network circuit is added according to an embodiment of the disclosure.

Referring to FIG. 13A, the graph 1300 illustrates the power gain of the Doherty power amplifier in the average power area for each frequency based on whether a network circuit is added according to an embodiment of the disclosure. The graph 1300 may represent the power gain of the Doherty power amplifier in the average power area for five frequencies at 100 MHz intervals from 3.4 GHz to 3.8 GHz. A horizontal axis of the graph 1300 represents frequency (unit: Gigahertz (GHz)), and a vertical axis of the graph 1300 represents the power gain (unit: decibel (dB)) in the average power area. A black graph may represent the power gain of the Doherty power amplifier coupled to a transmission line for impedance matching. The white graph may represent the power gain of the Doherty power amplifier in the average power area for each frequency in case that the network circuit for rotation of the dispersed impedance are combined.

It may be confirmed that the power gain of the power amplifier including the impedance rotation-based network matching circuit according to embodiments is greater than the power gain of a legacy power amplifier. Through a large power gain, a possible frequency band is expanded. The network circuit for rotation of the dispersed impedance according to embodiments may provide a band expansion effect.

Figure 13B:
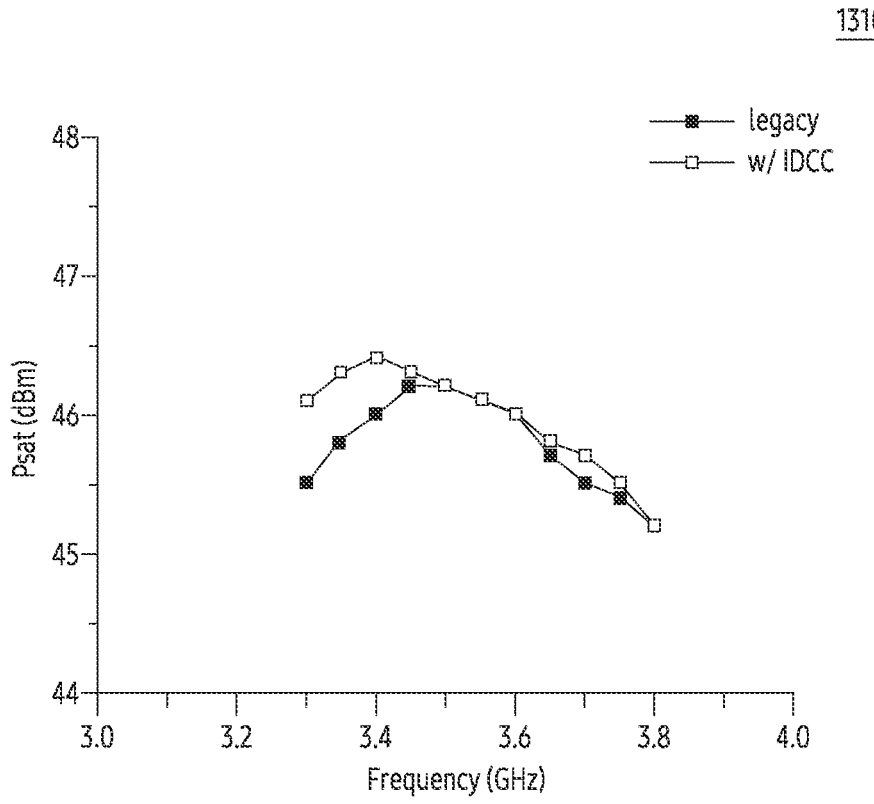
FIG. 13B illustrates maximum output power for each frequency of a Doherty power amplifier based on whether a network circuit is added according to an embodiment of the disclosure.

FIG. 13B illustrates maximum output power for each frequency of a Doherty power amplifier based on whether a network circuit is added according to an embodiment of the disclosure.

Referring to FIG. 13B, a graph 1310 illustrates the maximum output power of the Doherty power amplifier for each frequency based on whether the network circuit according to an embodiment of the disclosure is added. The graph 1310 may represent the maximum output power of the Doherty power amplifier for five frequencies at intervals of 100 MHz from 3.4 GHz to 3.8 GHz. A horizontal axis of the graph 1310 represents frequency (unit: Gigahertz (GHz)), and a vertical axis of the graph 1310 represents the maximum output power (Psat) (unit: decibel milliwatt (dBm)). A black graph may represent the maximum output power for each frequency of the Doherty power amplifier coupled to a transmission line for impedance matching. A white graph may represent the maximum output power for each frequency of the Doherty power amplifier coupled to the network circuit for rotation of the dispersed impedance.

It may be confirmed that the maximum output power of the power amplifier including the network circuit for rotation of the dispersed impedance according to embodiments is greater than the maximum output power of a legacy power amplifier. Through a high maximum output power, a possible frequency band is expanded. The network circuit for rotation of the dispersed impedance according to embodiments may provide a band expansion effect.

Figure 13C:
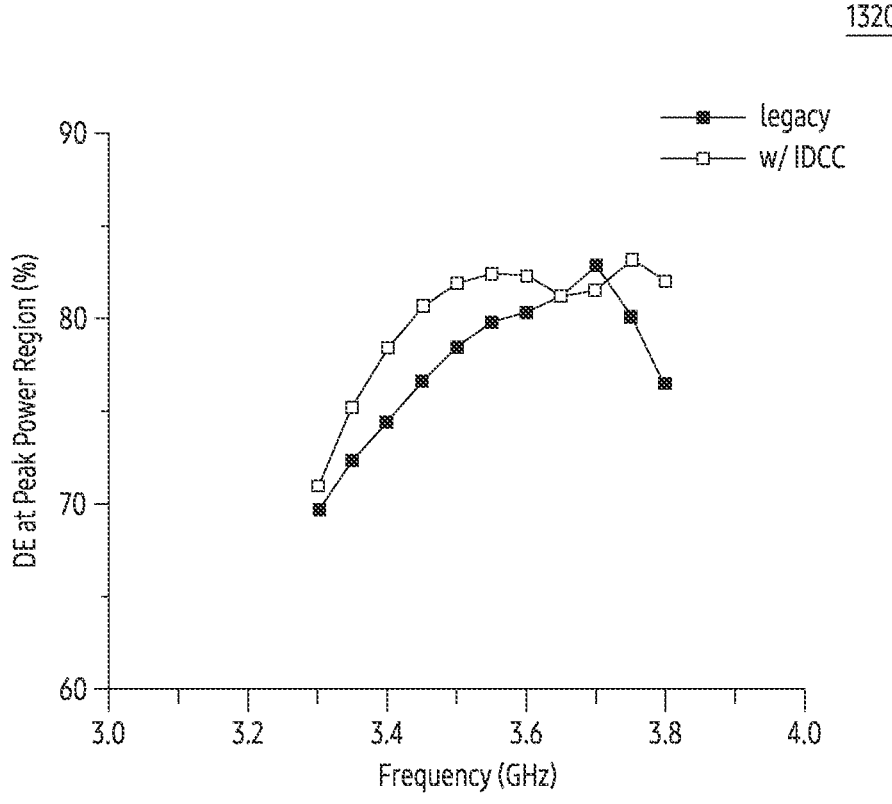
FIG. 13C illustrates drain efficiency at maximum output power for each frequency of a Doherty power amplifier based on whether a network circuit is added according to an embodiment of the disclosure.

FIG. 13C illustrates drain efficiency at maximum output power for each frequency of a Doherty power amplifier based on whether a network circuit is added according to an embodiment of the disclosure.

Referring to FIG. 13C, a graph 1320 illustrates the drain efficiency of the Doherty power amplifier in a maximum output power area for each frequency based on whether the network circuit is added according to an embodiment of the disclosure. The graph 1320 may represent the drain efficiency of the Doherty power amplifier in the maximum output power area for five frequencies at intervals of 100 MHz from 3.4 GHz to 3.8 GHz. A horizontal axis of the graph 1320 represents frequency (unit: GigaHertz (GHz)), and a vertical axis of the graph 1320 represents the drain efficiency (unit: percentage (%)) in the maximum output power area. A black graph may represent the drain efficiency at the maximum output power for each frequency of the Doherty power amplifier coupled to a transmission line for impedance matching. A white graph may represent the drain efficiency in the maximum output power area for each frequency of the Doherty power amplifier coupled to the network circuit for rotation of the dispersed impedance.

It may be confirmed that the drain efficiency of the power amplifier including the network circuit for rotation of the dispersed impedance according to embodiments is greater than the drain efficiency of a legacy power amplifier. Through a high drain efficiency, a possible frequency band is expanded. The network circuit for rotation of the dispersed impedance according to embodiments may provide a band expansion effect.

Figure 13D:
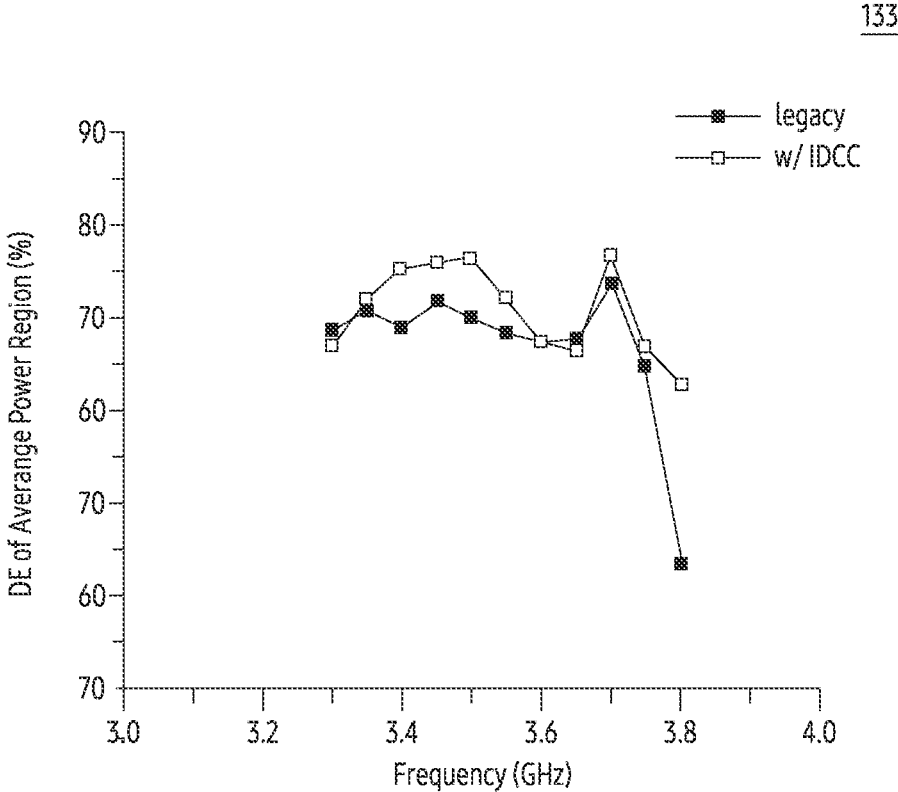
FIG. 13D illustrates drain efficiency at average output power for each frequency of a Doherty power amplifier based on whether a network circuit is added according to an embodiment of the disclosure.

FIG. 13D illustrates drain efficiency at average output power for each frequency of a Doherty power amplifier based on whether a network circuit is added according to an embodiment of the disclosure.

Referring to FIG. 13D, the graph 1330 illustrates the drain efficiency of the Doherty power amplifier in an average output power area for each frequency according to whether the network circuit is added, which is an embodiment of the disclosure. The graph 1330 may represent the drain efficiency of the Doherty power amplifier in the average output power area for five frequencies at intervals of 100 MHz from 3.4 GHz to 3.8 GHz. A horizontal axis of the graph 1330 represents frequency (unit: Gigahertz (GHz)), and a vertical axis of the graph 1320 represents the drain efficiency (unit: percentage (%)) in the average output power area. A black graph may represent the drain efficiency in the average output power area per frequency of the Doherty power amplifier, which does not include the network circuit for rotation of the dispersed impedance. A white graph may represent the drain efficiency in the average output power area per frequency of the Doherty power amplifier including the network circuit for rotation of the dispersed impedance.

It may be confirmed that the drain efficiency at the average output power of the power amplifier including the network circuit for rotation of the dispersed impedance according to embodiments is greater than the drain efficiency at the average output power of a legacy power amplifier. Through the drain efficiency at high average output power, a possible frequency band is expanded. The network circuit for rotation of the dispersed impedance according to embodiments may provide a band expansion effect.

The Doherty power amplifier according to embodiments of the disclosure may include a matching network circuit implemented in a simpler manner than the Doherty power amplifier that fixes load impedance and uses a multi-stage circuit. By adjusting a length of a resonance circuit and a transmission line, a degree of impedance dispersion and a degree of rotation may be controlled. A circuit structure for matching is simplified by providing controlled impedance to a load network of a carrier amplifier and a peaking amplifier. Accordingly, performance such as maximum output power, efficiency, linearity, and the like in a wider band is improved. The matching network circuit according to embodiments of the disclosure may minimize power consumption and heat generation by minimizing matching loss in a wireless communication system. Minimizing power consumption and heat generation leads to improved performance of the entire wireless communication system.

A device and a method according to embodiments of the disclosure may control the dispersion degree and rotation degree of impedance by adjusting the length of the resonance circuit and the transmission line in the network circuit.

The circuit structure for matching is simplified by providing the controlled impedance to the load network of the carrier amplifier and the peaking amplifier. In addition, the performance such as the maximum output power, the efficiency, the linearity, and the like in the wider band may be improved.

As described above, according to embodiments, an electronic device including Doherty power amplifier may comprise a carrier amplifier, a first circuit coupled to an output terminal of the carrier amplifier, a peaking amplifier, a second circuit coupled to an output terminal of the peaking amplifier, and a network circuit. The network circuit may include the Doherty power amplifier and a transmission line for impedance matching with a resonance circuit. The resonance circuit may be disposed between a first area and a second area of the transmission line. In the electronic device, the Doherty power amplifier may provide an output impedance in a first range distributed based on a frequency within a bandwidth, and the network circuit may provide a load impedance. The network circuit may provide a load impedance in a second range distributed based on the frequency within the bandwidth. The first area of the transmission line may provide a first phase shift impedance to reduce a difference between the output impedance in the first range and the load impedance in the second range. The second area of the transmission line may provide a second phase shift impedance.

According to an embodiment, the resonance circuit may include a first transmission line composed of a short circuit and a second transmission line composed of an open circuit.

According to an embodiment, the resonance circuit may include an inductor and a capacitor connected in series.

According to an embodiment, the resonance circuit may include an inductor and a capacitor connected in parallel.

According to an embodiment, the transmission line may be a microstrip.

According to an embodiment, the transmission line may include capacitors and inductors arranged in a π-type.

According to an embodiment, the transmission line may include capacitors and inductors arranged in a T-type.

According to an embodiment, the load impedance in the second range may be provided by applying the first phase shift impedance to a dispersion impedance of the resonance circuit distributed based on a frequency within the bandwidth.

According to an embodiment, the first area of the transmission line rotates the dispersion impedance of the resonance circuit on a Smith chart to reduce a difference between the dispersion impedance of the resonance circuit and the output impedance in the first range, through the first phase shift impedance.

According to an embodiment, the resonance circuit may be variably disposed between the first area and the second area of the transmission line. The first phase shift impedance may be a first value and the second phase shift impedance may be a second value, in case that the resonance circuit is in a first position. The first phase shift impedance may be a third value different from the first value and the second phase shift impedance is a fourth value different from the second value, in case that the resonance circuit is in a second position. Sum of the first value and the second value may be equal to sum of the third value and the fourth value.

As described above, a radio frequency integrated circuit (RFIC) according to embodiments may comprise a plurality of radio frequency (RF) processing chains. Each of the plurality of RF processing chains may include a phase shifter and a Doherty power amplifier. The Doherty power amplifier may include a carrier amplifier, a first circuit coupled to output terminal of the carrier amplifier, a peaking amplifier, a second circuit coupled to the output terminal of the peaking amplifier, and a network circuit. The network circuit may include a transmission line for impedance matching with a resonance circuit and the Doherty power amplifier. In the electronic device, the resonance circuit may be disposed between a first area and a second area of the transmission line. The Doherty power amplifier may provide an output impedance in a first range distributed based on a frequency within a bandwidth, and the network circuit may provide a load impedance. The network circuit may provide a load impedance in a second range distributed based on the frequency within the bandwidth. The first area of the transmission line may provide a first phase shift impedance to reduce a difference between the output impedance in the first range and the load impedance in the second range. The second area of the transmission line may provide a second phase shift impedance.

According to an embodiment, wherein the resonance circuit may include a first transmission line composed of a short circuit and a second transmission line composed of an open circuit.

According to an embodiment, wherein the resonance circuit may include an inductor and a capacitor connected in series.

According to an embodiment, wherein the resonance circuit may include an inductor and a capacitor connected in parallel.

According to an embodiment, the transmission line may be a microstrip.

According to an embodiment, the transmission line may include capacitors and inductors arranged in a π-shape.

According to an embodiment, the transmission line may include capacitors and inductors arranged in a T-type.

According to an embodiment, the load impedance in the second range may be provided by applying the first phase shift impedance to a dispersion impedance of the resonance circuit distributed based on a frequency within the bandwidth.

According to an embodiment, the first area of the transmission line may rotate the dispersion impedance of the resonance circuit on a Smith chart to reduce a difference between the dispersion impedance of the resonance circuit and the output impedance in the first range, through the first phase shift impedance.

According to an embodiment, the resonance circuit may be variably disposed between the first area and the second area of the transmission line. The first phase shift impedance may be a first value and the second phase shift impedance may be a second value, in case that the resonance circuit is in a first position. The first phase shift impedance may be a third value different from the first value and the second phase shift impedance may be a fourth value different from the second value, in case that the resonance circuit is in a second position. Sum of the first value and the second value may be equal to sum of the third value and the fourth value.

Methods according to the embodiments described in the claims or the specification of the disclosure may be implemented in the form of hardware, software, or a combination of hardware and software.

When implemented as software, a computer-readable storage medium storing one or more program (software module) may be provided. The one or more program stored in the computer-readable storage medium is configured for execution by one or more processor in the electronic device. The one or more program include instructions that cause the electronic device to execute methods according to embodiments described in the claim or the specification of the disclosure.

Such program (software modules, software) may be stored in random access memory, non-volatile memory including flash memory, read only memory (ROM), electrically erasable programmable read only memory (EEPROM), magnetic disc storage device, compact disc-ROM (CD-ROM), digital versatile disc (DVD) or other form of optical storage, magnetic cassette. Alternatively, it may be stored in a memory configured with some or all combinations thereof. In addition, each configuration memory may be included a plurality.

In addition, the program may be stored in an attachable storage device that may be accessed through a communication network, such as the Internet, Intranet, local area network (LAN), wide area network (WAN), or storage area network (SAN), or a combination thereof. Such a storage device may be connected to a device performing an embodiment of the disclosure through an external port. In addition, a separate storage device on the communication network may access a device performing an embodiment of the disclosure.

In the above-described specific embodiments of the disclosure, the component included in the disclosure is expressed in singular or plural according to the presented specific embodiment. However, singular or plural expression is chosen appropriately for the situation presented for convenience of explanation, and the disclosure is not limited to singular or plural component, and even if the component is expressed in plural, it may be configured with singular, or even if it is expressed in singular, it may be configured with plural.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device including a doherty power amplifier, the electronic device comprising:
a carrier amplifier;
a first circuit connected to the carrier amplifier;
a peaking amplifier;
a second circuit connected to the peaking amplifier; and
a network circuit,
wherein the network circuit includes a first transmission line connected to an output terminal of the first circuit and the second circuit, a second transmission line, and a resonance circuit;
disposed between the first transmission line and the second transmission line,
wherein an output impedance from the network circuit to the output terminal of the first circuit and the second circuit depends on a frequency within a bandwidth,
wherein the resonance circuit is used to change a load impedance from the output terminal of the first circuit and the second circuit to the network circuit in accordance with a frequency within the bandwidth,
wherein an electrical length of the first transmission line is used to
provide values of the load impedance over frequencies within the bandwidth; corresponding to values of the output impedance over the frequencies within the bandwidth.

2. The electronic device of claim 1, wherein the resonance circuit includes a third transmission line composed of a short circuit and a fourth transmission line composed of an open circuit.

3. The electronic device of claim 1, wherein the resonance circuit includes an inductor and a capacitor connected in series.

4. The electronic device of claim 1, wherein the resonance circuit includes an inductor and a capacitor connected in parallel.

5. The electronic device of claim 1, wherein the first transmission line is a microstrip.

6. The electronic device of claim 1, wherein the first transmission line includes capacitors and inductors arranged in a π-type.

7. The electronic device of claim 1, wherein the first transmission line includes capacitors and inductors arranged in a T-type.

8. The electronic device of claim 1, wherein a sum of a value of the electrical length of the first transmission line and a value of an electrical length of the second transmission line is 90 degrees.

9. The electronic device of claim 1, wherein a value in accordance with a corresponding frequency within the bandwidth from among the values of the load impedance is complex conjugate of a value in accordance with the corresponding frequency within the bandwidth among the values of the output impedance.

10. The electronic device of claim 1, wherein the second transmission line is a microstrip.

11. A radio frequency integrated circuit (RFIC) in a wireless communication system, the RFIC comprising:

a plurality of radio frequency (RF) processing chains, wherein each of the plurality of RF processing chains includes a phase shifter and a doherty power amplifier, wherein the doherty power amplifier includes:

a carrier amplifier, a first circuit connected to the carrier amplifier, a peaking amplifier, a second circuit connected to the peaking amplifier, and a network circuit, wherein the network circuit includes a first transmission line connected to an output terminal of the first circuit and the second circuit, a second transmission line, and a resonance circuit disposed between the first transmission line and the second transmission line, wherein an output impedance from the network circuit to the output terminal of the first circuit and the second circuit depends on a frequency within a bandwidth, wherein the resonance circuit is used to change a load impedance from the output terminal of the first circuit and the second circuit to the network circuit in accordance with a frequency within the bandwidth, wherein an electrical length of the first transmission line is used to provide values of the load impedance over frequencies within the bandwidth corresponding to values of the output impedance over the frequencies within the bandwidth.

12. The RFIC of claim 11, wherein the resonance circuit includes a third transmission line composed of a short circuit and a fourth transmission line composed of an open circuit.

13. The RFIC of claim 11, wherein the resonance circuit includes an inductor and a capacitor connected in series.

14. The RFIC of claim 11, wherein the resonance circuit includes an inductor and a capacitor connected in parallel.

15. The RFIC of claim 11, wherein the first transmission line is a microstrip.

16. The RFIC of claim 11, wherein the first transmission line includes capacitors and inductors arranged in a π-shape.

17. The RFIC of claim 11, wherein the first transmission line includes capacitors and inductors arranged in a T-type.

18. The RFIC of claim 11, wherein a sum of a value of the electrical length of the first transmission line and a value of an electrical length of the second transmission line is 90 degrees.

19. The RFIC of claim 18, wherein a value in accordance with a corresponding frequency within the bandwidth from among the values of the load impedance is complex conjugate of a value in accordance with the corresponding frequency within the bandwidth among the values of the output impedance.

20. The RFIC of claim 11, wherein the second transmission line is a microstrip.

* * * * *